(12) United States Patent
Miwa

(10) Patent No.: US 9,646,708 B2
(45) Date of Patent: May 9, 2017

(54) INPUT/OUTPUT INTERFACE CIRCUITS AND METHODS FOR MEMORY DEVICES

(71) Applicant: SanDisk Technologies Inc., Plano, TX (US)

(72) Inventor: Hitoshi Miwa, Kamakura (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/706,195

(22) Filed: May 7, 2015

(65) Prior Publication Data

US 2016/0329106 A1    Nov. 10, 2016

(51) Int. Cl.
| | |
|---|---|
| *G11C 16/32* | (2006.01) |
| *G11C 16/26* | (2006.01) |
| *G11C 16/30* | (2006.01) |
| *G11C 7/10* | (2006.01) |
| *G11C 7/20* | (2006.01) |

(52) U.S. Cl.
CPC .............. *G11C 16/32* (2013.01); *G11C 7/106* (2013.01); *G11C 7/109* (2013.01); *G11C 7/1066* (2013.01); *G11C 7/20* (2013.01); *G11C 16/26* (2013.01); *G11C 16/30* (2013.01); *G11C 2207/2227* (2013.01)

(58) Field of Classification Search
CPC .......... G11C 16/30; G11C 16/26; G11C 16/32
USPC ..................................... 365/185.11
See application file for complete search history.

(56) References Cited

U.S. PATENT DOCUMENTS

| 2002/0048191 A1* | 4/2002 | Ikehashi | G11C 29/006 365/185.22 |
|---|---|---|---|
| 2011/0198941 A1* | 8/2011 | Suzuki | H03K 19/0016 307/116 |
| 2011/0291691 A1* | 12/2011 | Cho | G06F 1/3287 324/762.01 |

* cited by examiner

*Primary Examiner* — Alexander Sofocleous
*Assistant Examiner* — Alfredo Bermudez Lozada
(74) *Attorney, Agent, or Firm* — Vierra Magen Marcus LLP

(57) ABSTRACT

An input/output interface circuit is provided for a memory device. The input/output interface circuit receives a first control signal and a second control signal, and provides an output clock signal. The input/output interface circuit includes a plurality of circuit blocks coupled in series, the a plurality of circuit blocks including an input terminal coupled to the first control signal and the second control signal, and an output terminal providing the output clock signal, a plurality of power switch transistors, each power switch transistor including a control terminal and coupled between a corresponding one of the circuit blocks and a power supply terminal, and a plurality of switch control circuits, each switch control circuit coupled to the control terminal of a corresponding one of the power switch transistors. The switch control circuits are configured to activate the circuit blocks in a first predetermined order and deactivate the circuit blocks in a second predetermined order.

25 Claims, 30 Drawing Sheets

INPUT/OUTPUT INTERFACE CIRCUITS AND METHODS FOR MEMORY DEVICES

BACKGROUND

The present technology relates to non-volatile memory.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. Despite the higher cost, flash memory is increasingly being used in mass storage applications. More recently, flash memory in the form of solid-state disks (SSD) is beginning to replace hard disks in portable computers as well as in fixed location installations.

In flash memory devices, a memory cell can include a floating gate that is positioned above and insulated from a channel region in a semiconductor substrate, in a two-dimensional (2D) NAND configuration. The floating gate is positioned between source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate. A memory cell can have a floating gate that is used to store two or more ranges of charges, where each range represents a data state.

Moreover, ultra-high density storage devices have been proposed using a three-dimensional (3D) stacked memory structure which is formed from an array of alternating conductive and dielectric layers. One example is the Bit Cost Scalable (BiCS) architecture. A memory hole is drilled in the layers, and a NAND string is formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

High performance integrated-circuit memory devices typically have multiple die or chips controlled by a memory controller. Each die contains a memory array with peripheral circuits. At any one time, many of these multiple die may be involved in various memory operations including input or output operations with the memory controller. For example, in enterprise SSD and Client SSD the input/output (I/O) requirements are demanding. In some instances, 8 to 16 die are stacked on the same I/O channel and they are operating at 200 MHz (DDR2) speed with reduced power.

One issue has to do with I/O interface circuits for memory devices. An important characteristics for memory devices, such as flash memory devices is the ability to achieve high speed read/write operation in semiconductor storage systems. However, improving I/O interface circuit speed while meeting standby current limits is technically challenging.

DETAILED DESCRIPTION

Technology is described that provides high speed interface circuits that include high speed circuit blocks coupled to power supply terminals via power switch transistors. Switch control circuits are used to turn ON and OFF the power switch transistors to activate and inactivate the high speed circuit blocks in a predetermined order from a first control signal input to a clock output.

Figure 1:
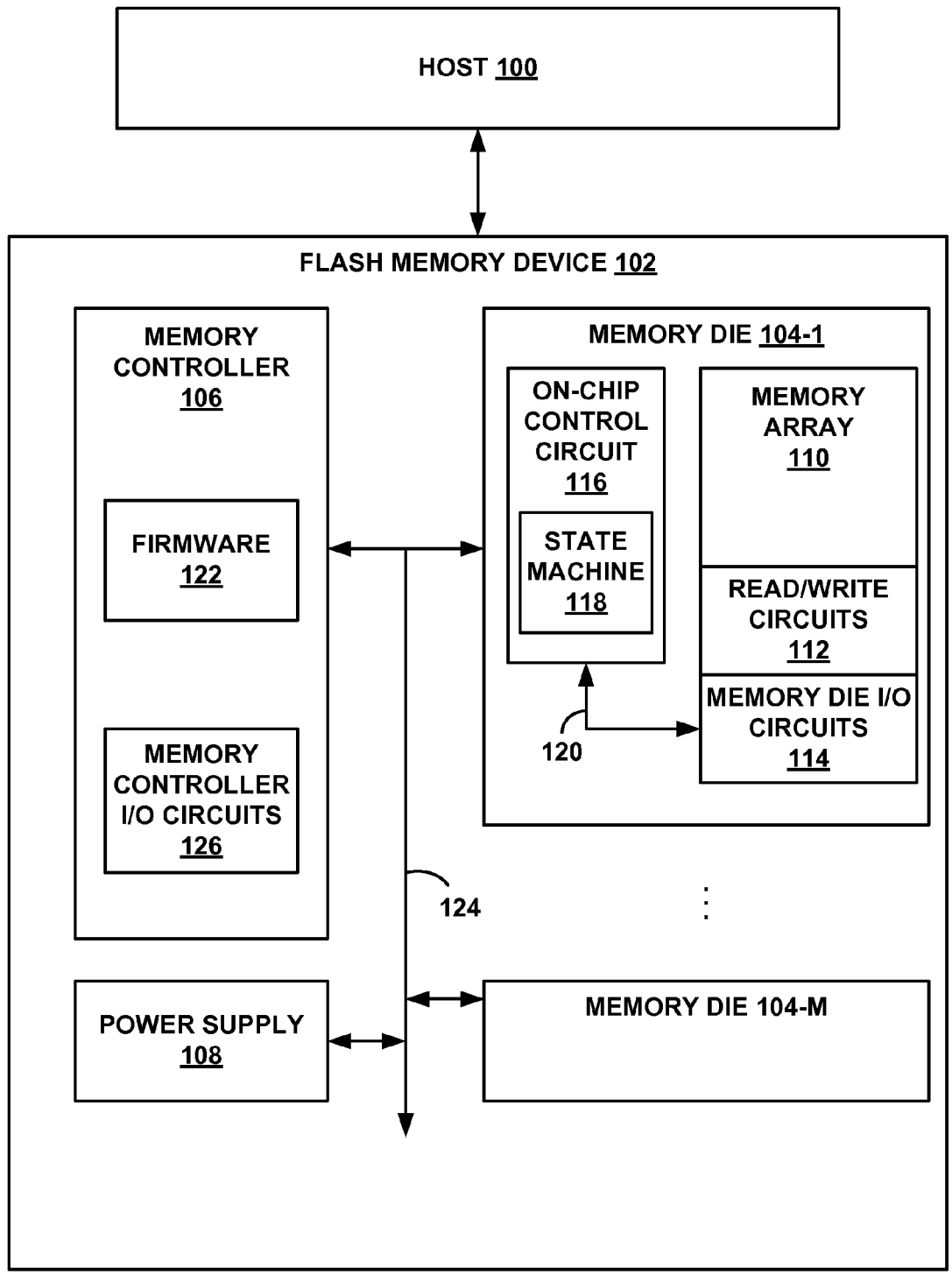
FIG. 1 is a block diagram of a host and memory device.

FIG. 1 illustrates a host 100 in communication with a memory device 102. Host 100 typically sends data to be stored in memory device 102 or retrieves data by reading memory device 102. Memory device 102 includes one or more memory die 104 managed by a memory controller 106. Memory controller 106 is typically implemented as another chip with CMOS circuit elements. FIG. 1 shows, for example the memory device having M die, such as memory die 104-1, . . . , memory die 104-M. Memory device 102 is powered by a power supply 108 that has a predetermined maximum capacity.

Each memory die 104-1, . . . , 104-M includes a memory array 110 of memory cells. In an embodiment, the memory cells are flash EEPROM memory cells arranged in a NAND architecture. In an embodiment, each memory cell is capable of being configured as a multi-level cell (MLC) for storing multiple bits of data, as well as capable of being configured as a single-level cell (SLC) for storing 1 bit of data. Each memory die 104-1, . . . , 104-M also includes peripheral circuits such as row and column decoders (not shown), read/write circuits 112 and die I/O circuits 114. An on-chip control circuit 116 controls low-level memory operations of each die. On-chip control circuit 116 is a controller that cooperates with the peripheral circuits to perform memory operations on memory array 110. On-chip control circuit 116 includes a state machine 118 to provide die or chip level control of low-level memory operations via an internal bus 120 for carrying control signals, data and addresses.

In many implementations, host 100 communicates and interacts with each of memory die 104-1, ..., 104-M via memory controller 106. Memory controller 106 cooperates with memory die 104-1, ..., 104-M and controls and manages higher level memory operations. Memory controller include firmware 122, which provides codes to implement the functions of memory controller 106.

For example, in a host write, host 100 sends data to be written to memory array 110 in logical sectors allocated from a file system of the host's operating system. A memory block management system implemented in the controller stages the sectors and maps and stores them to the physical structure of the memory array.

To improve read and program performance, multiple charge storage elements or memory transistors in an array are read or programmed in parallel. Thus, a "page" of memory elements are read or programmed together. In existing memory architectures, a row typically contains several interleaved pages or it may constitute one page. Preferably, all memory elements of a page are read or programmed together.

A memory device bus 124 provides communications and power between memory controller 106, power supply 108 and memory die 104-1, ..., 104-M. An I/O channel is established between memory controller 106 and each of memory die 104-1, ..., 104-M via memory device bus 124 and internal bus 120. Each I/O channel has a controller I/O circuit 126 and one of I/O circuits 114 of memory die 104-1, ..., 104-M as endpoints.

Figure 2A:
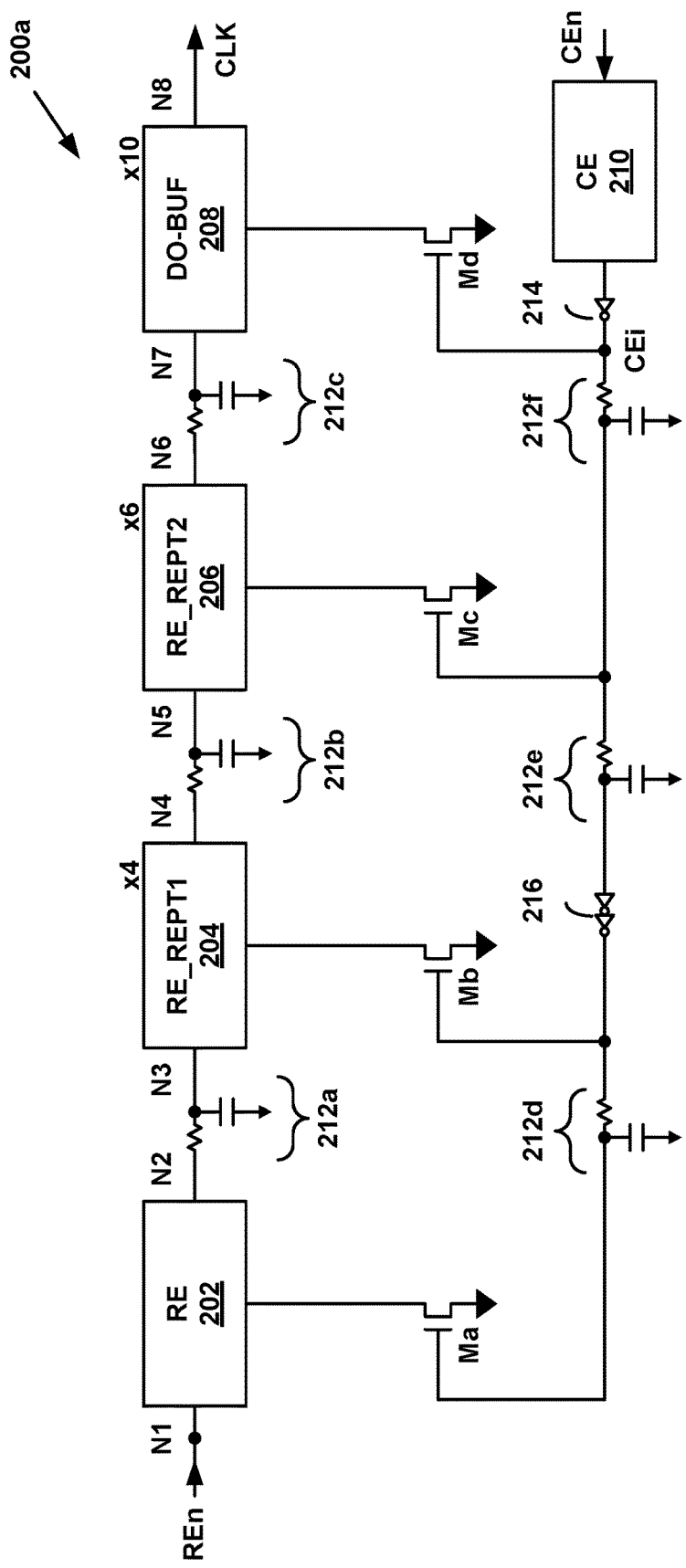
FIGS. 2A-2B are diagrams illustrating an example I/O interface circuit for memory devices.
Figure 2B:
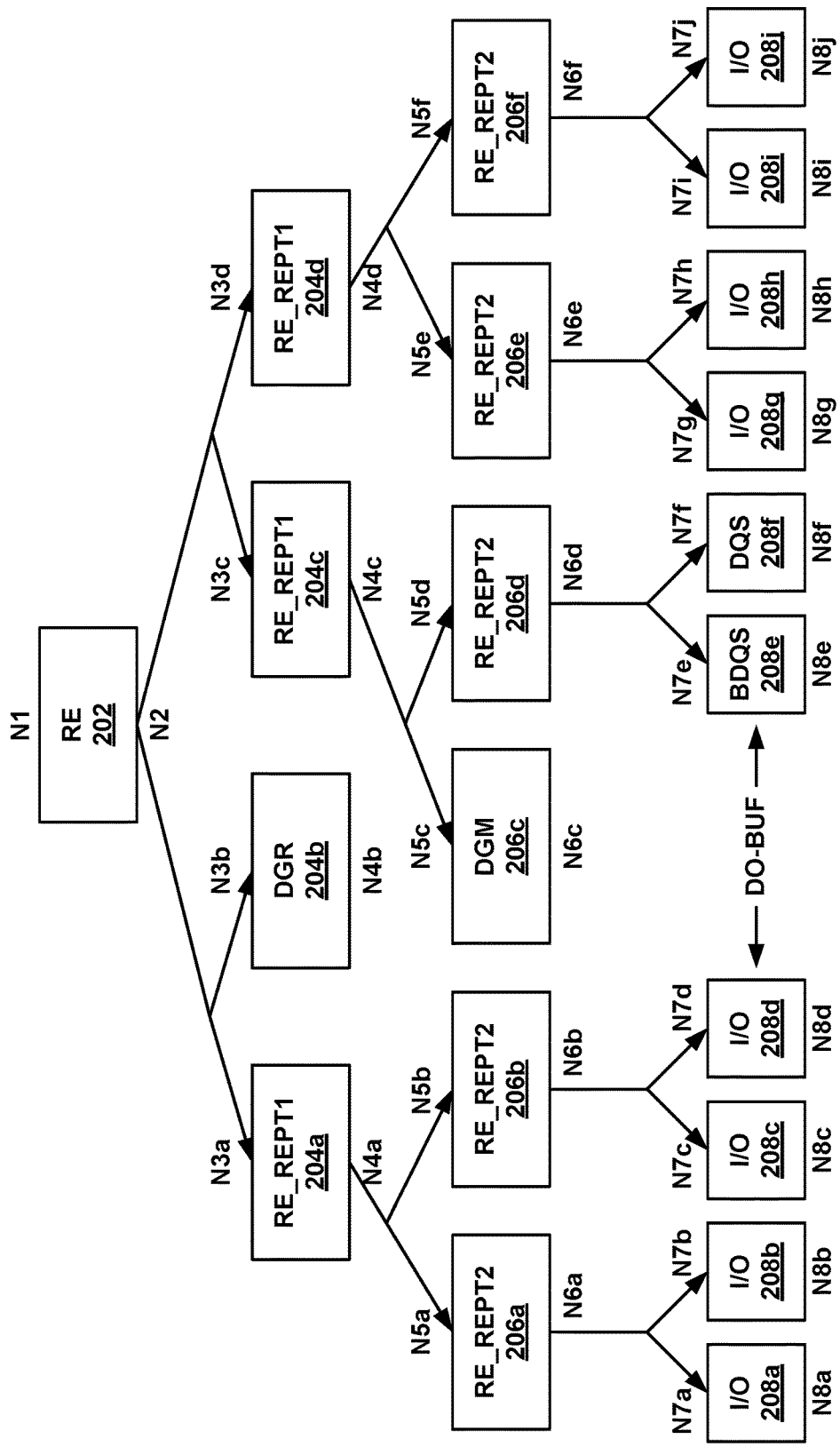
Figure 2C:
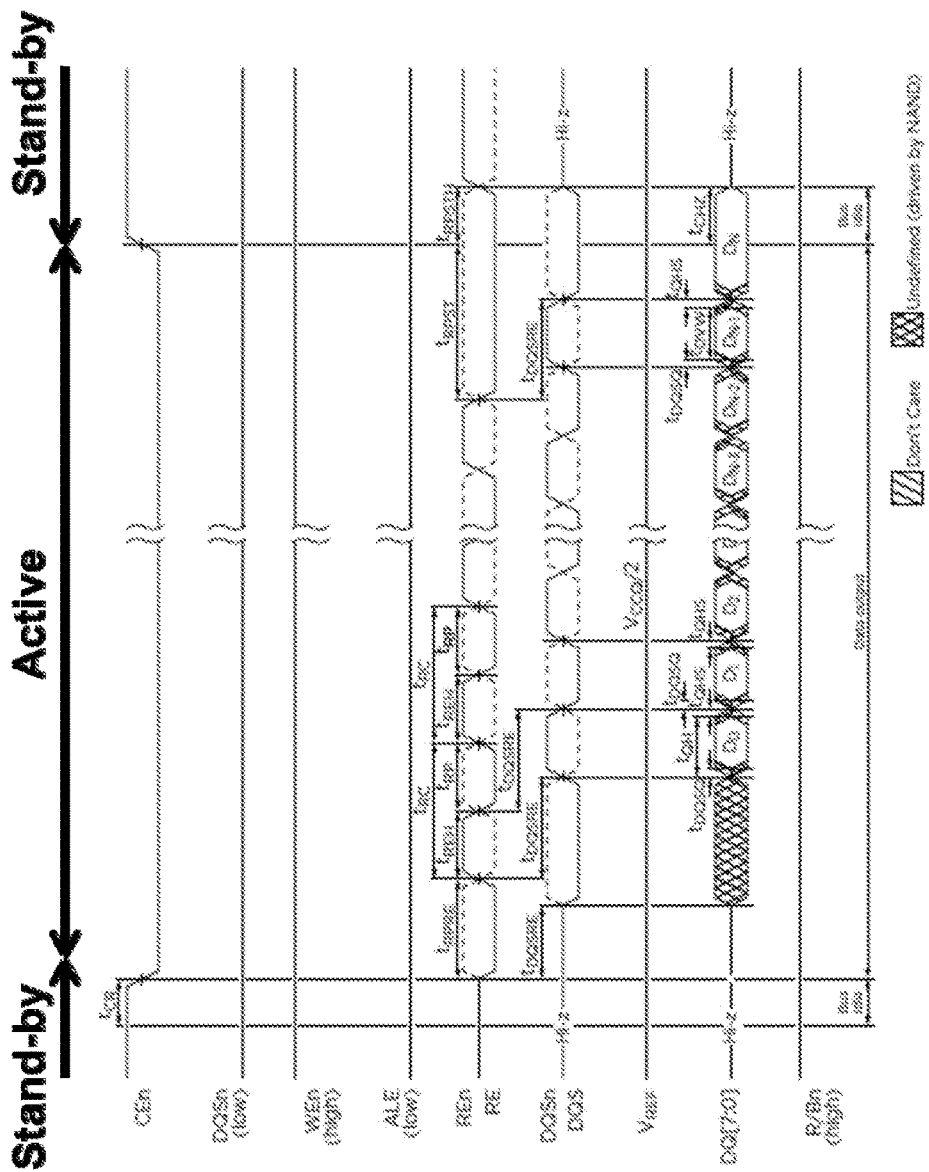
FIG. 2C is a diagram of example waveforms for I/O interface circuits.

FIGS. 2A-2B are diagrams illustrating an example high speed interface circuit 200a for memory devices, such as memory device 102 of FIG. 1. Interface circuit 200a receives a read enable negative (REn) and a chip enable negative (CEn) signal and provides clock signals CLK that provide data output timing to data output buffers (e.g., DQ0, DQ1, ..., DQ7, DQS and BDQS, not shown). As used herein, high speed interface circuit 200a is also referred to as "read enable circuit 200a." FIG. 2C illustrates example waveforms for read enable circuit 200a. When CEn is HIGH, memory device 102 is disabled and it is in stand-by state, and clock signal CLK is static (e.g., LOW or HIGH). When CEn is LOW, memory device 102 is in an active state, and read enable circuit 200a generates clock signals CLK based on REn.

Read enable circuit 200a includes an REn signal input buffer circuit 202, first repeater circuits 204a-204d, second repeater circuits 206a-206f, data output buffer circuits 208a-208j, and a CEn signal input buffer circuit 210. REn signal input buffer circuit 202 has a first node N1 and a second node N2, each of first repeater circuits 204a-204d has a third node N3a-N3d, respectively, and a fourth node N4a-N4d, respectively, each of second repeater circuits 206a-206f has a fifth node N5a-N5f and a sixth node N6a-N6f, respectively, and each of data output buffer circuits 208a-208j has a seventh node N7a-N7j, respectively, and an eighth node N8a-N8j, respectively.

For a high speed interface circuit like read enable circuit 200a, matched wire lengths and a tree-structure such as shown in FIG. 2B are typically used to balance conductor resistance and parasitic capacitances 212a-212c. Read enable circuit 200a also may include an inverter circuit 214 and a buffer circuit 216. REn signal input buffer circuit 202, first repeater circuits 204a-204d, second repeater circuits 206a-206f, and data output buffer circuits 208a-208j typically include CMOS logic circuits that include high speed transistors (not shown) to improve the speed of read enable circuit 200a. Accordingly, REn signal input buffer circuit 202, first repeater circuits 204a-204d, second repeater circuits 206a-206f, data output buffer circuits 208a-208j are referred to herein as "high speed circuit blocks."

High speed transistors (e.g., transistors having lower input capacitance and higher output current (Ion) than "nominal speed" transistors for a given semiconductor fabrication technology) may be fabricated by using shorter gate length (Lg) and/or lower threshold voltages (Vth) than nominal speed transistors. However, the shorter gate length or lower threshold voltage may increase off leak current (Ioff) that result in higher stand-by current of the memory. Such high stand-by current may be a big disadvantage, especially for battery operated storage system.

To avoid this problem, power switch transistors Ma, Mb, Mc and Md are used to disconnect the high speed circuit blocks from power supply terminals (e.g., VDD and/or VSS) during standby mode. That is, when CEn is HIGH (standby mode), internal chip enable (CEi) signal is LOW, the gates of power switch transistors Ma, Mb, Mc and Md are LOW, power switch transistors Ma, Mb, Mc and Md are all OFF, and therefore the high speed circuit blocks are all disconnected from the negative power supply terminal and are inactive.

In standby mode, internal nodes in the high speed circuit blocks are floating, and the voltage levels of nodes N2-N7 may vary depending on leakage current of transistors connected to the nodes. Immediately after any of power switch transistors Ma, Mb, Mc and Md turns ON, if the voltage of a node happens to be close to a logic threshold level (Vthl) of the next logic stage, a shoot through current may flow through the next logic stage. Because the voltage is not predictable, the total magnitude of the shoot through current can be large enough to cause problems such as power droop and resulting timing margin deterioration.

Indeed, when CEn first goes LOW, CEi signal goes HIGH, power switch transistor Md turns ON, and data output buffer circuits 208a-208j become active. However, node N7 is not fixed HIGH or LOW because power switch transistor Mc is still OFF and second repeater circuits 206a-206f are not active. So a shoot through current may flow in data output buffer circuits 208a-208j. Similar shoot through currents may flow in second repeater circuits 206a-206f and first repeater circuits 204a-204d as power switches Mc and Mb turn ON.

In addition, as the high speed circuit blocks are activated in an order of data output buffer circuits 208a-208j, second repeater circuits 206a-206f, first repeater circuits 204a-204d and REn signal input buffer circuit 202, node N2 is the last node to settle, and thus variations in node N2 voltage can cause fluctuations of the voltages of the entire path of nodes N4, N6 and N8. So in addition to the shoot through current, extra charging and discharging current may flow. This again results in unpredictable power source current and can cause problems such as power droop and resulting timing margin deterioration.

Figure 2D:
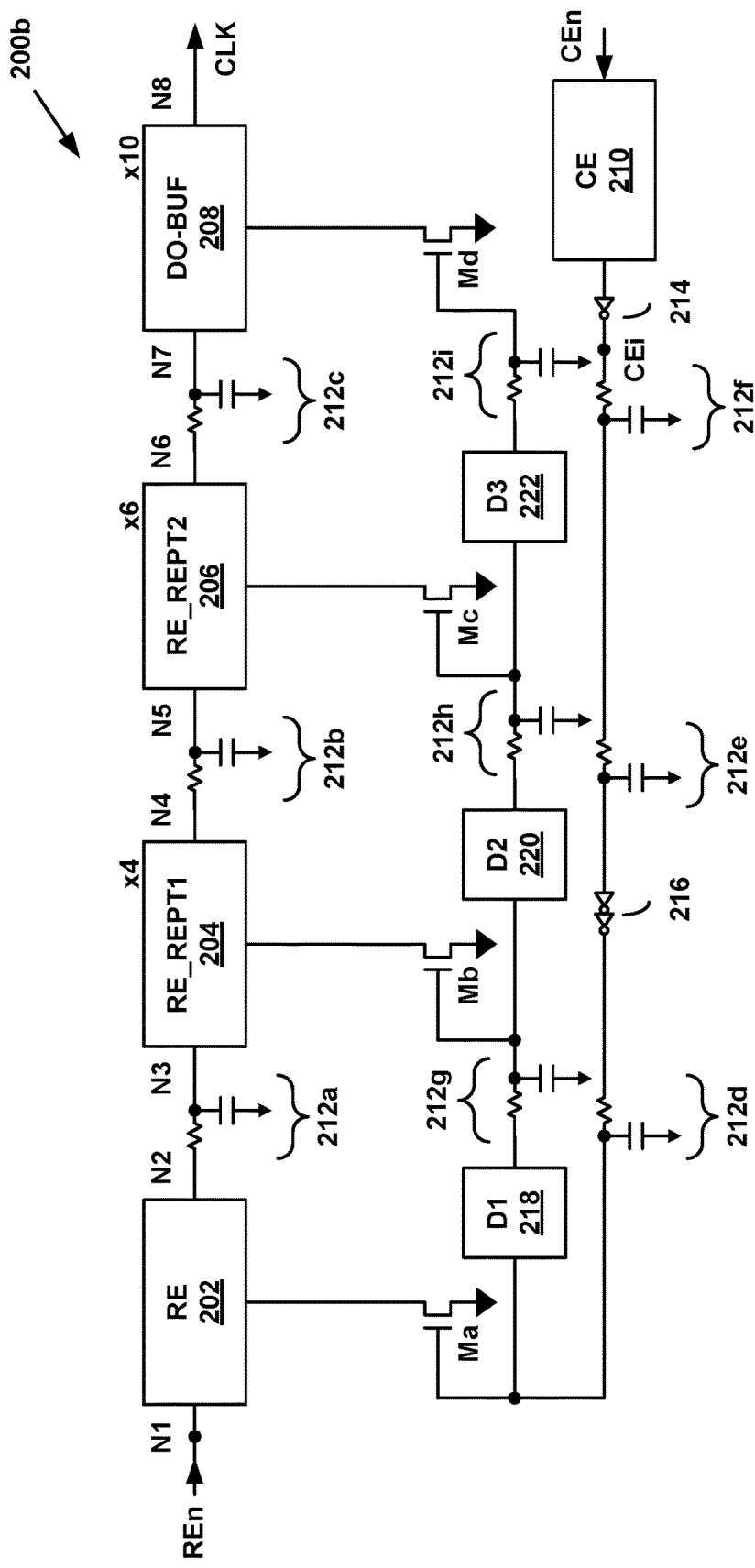
FIGS. 2D-2E are diagrams illustrating another example I/O interface circuit for memory devices.
Figure 2E:
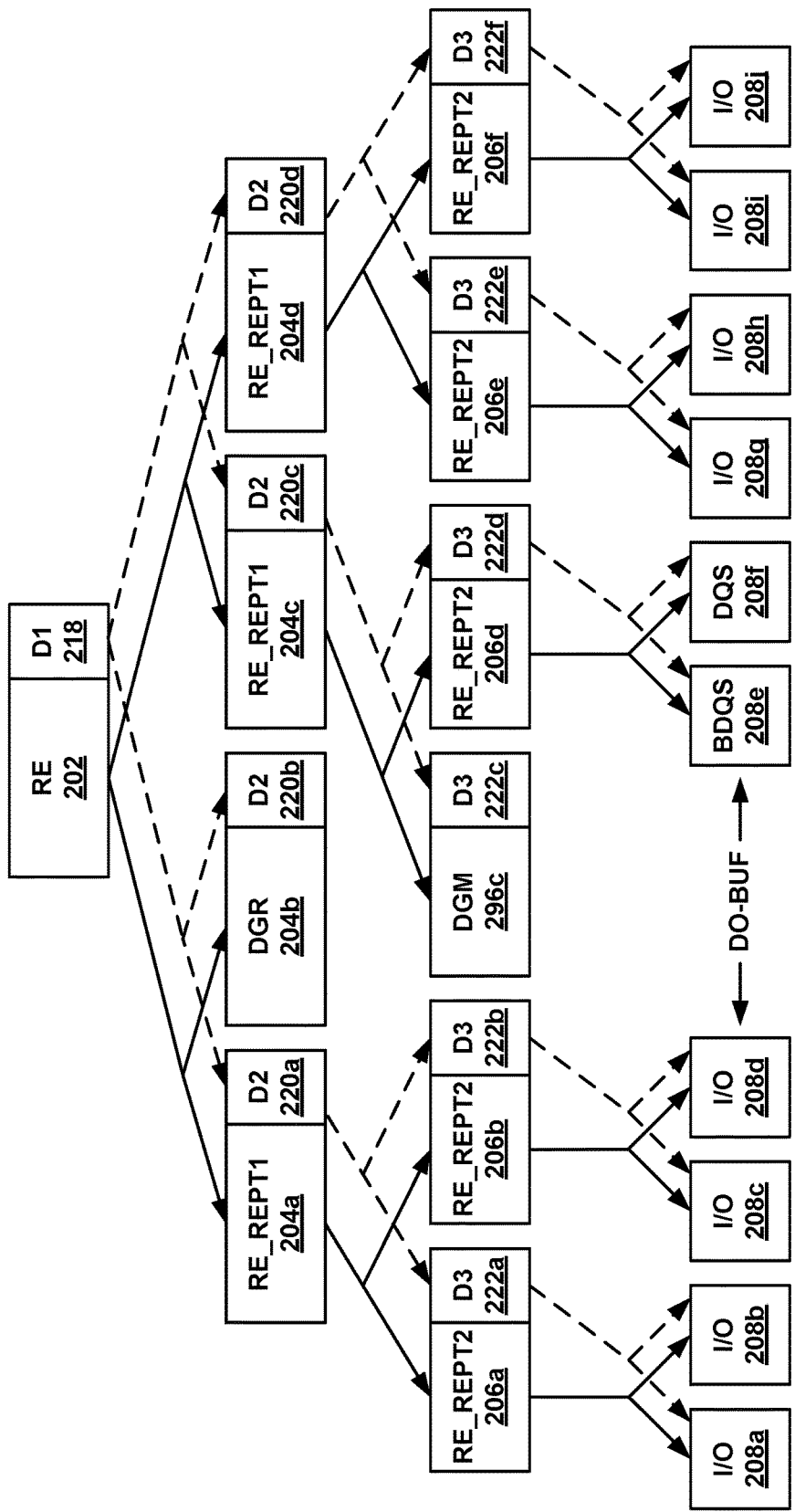

FIGS. 2D-2E are diagrams illustrating another example read enable circuit 200b. In read enable circuit 200b, signal line CEi is routed first to power switch transistor Ma, and is then routed to power switch transistors Mb, Mc and Md through delay circuits D1, D2 and D3, respectively. In FIG. 2E, the routing of signal line CEi from delay circuits D1, D2 and D3 is shown using a dashed line.

In an ideal circuit, read enable circuit 200b avoids the shoot-through current issue and the charging/discharging issue caused by internal signal toggling because the high speed circuit blocks are activated in a sequential order from REn signal input to CLK output as a result of delay circuits D1-D3 and conductor resistance and parasitic capacitances 212g-212i. In other words, REn signal input buffer circuit 202 is activated, first repeater circuits 204a-204d are activated after REn signal input buffer circuit 202, second repeater circuits 206a-206f are activated after first repeater circuits 204a-204d, and then data output buffer circuits 208a-208j are activated after second repeater circuits 206a-206f, and the nodes N1-N7 have fixed values before each subsequent stage is activated.

However, read enable circuit 200b requires very tight control of delay circuits D1-D3. If the delay time is too long, the timing margin of tCS (CEn setup time) and tRPRE (read preamble time) will be reduced. If the delay time is too short, shoot-through current and charging/discharging issue caused by internal signal toggling such as in read enable circuit 200a may occur. Further, delay circuits D1-D3 require a large layout area, particularly the routing of signal line CEi, which requires matched length signal traces as depicted in FIG. 2E. Such matched length wiring consumes a large amount of metal layer layout area.

Technology is described that provides a high speed interface circuit that includes high speed circuit blocks coupled to power supply terminals via power switch transistors. Switch control circuits are used to turn ON and OFF the power switch transistors to activate high speed circuit blocks in a sequential order from a REn signal input to a CLK output without requiring tightly controlled delay circuits.

Figure 3A:
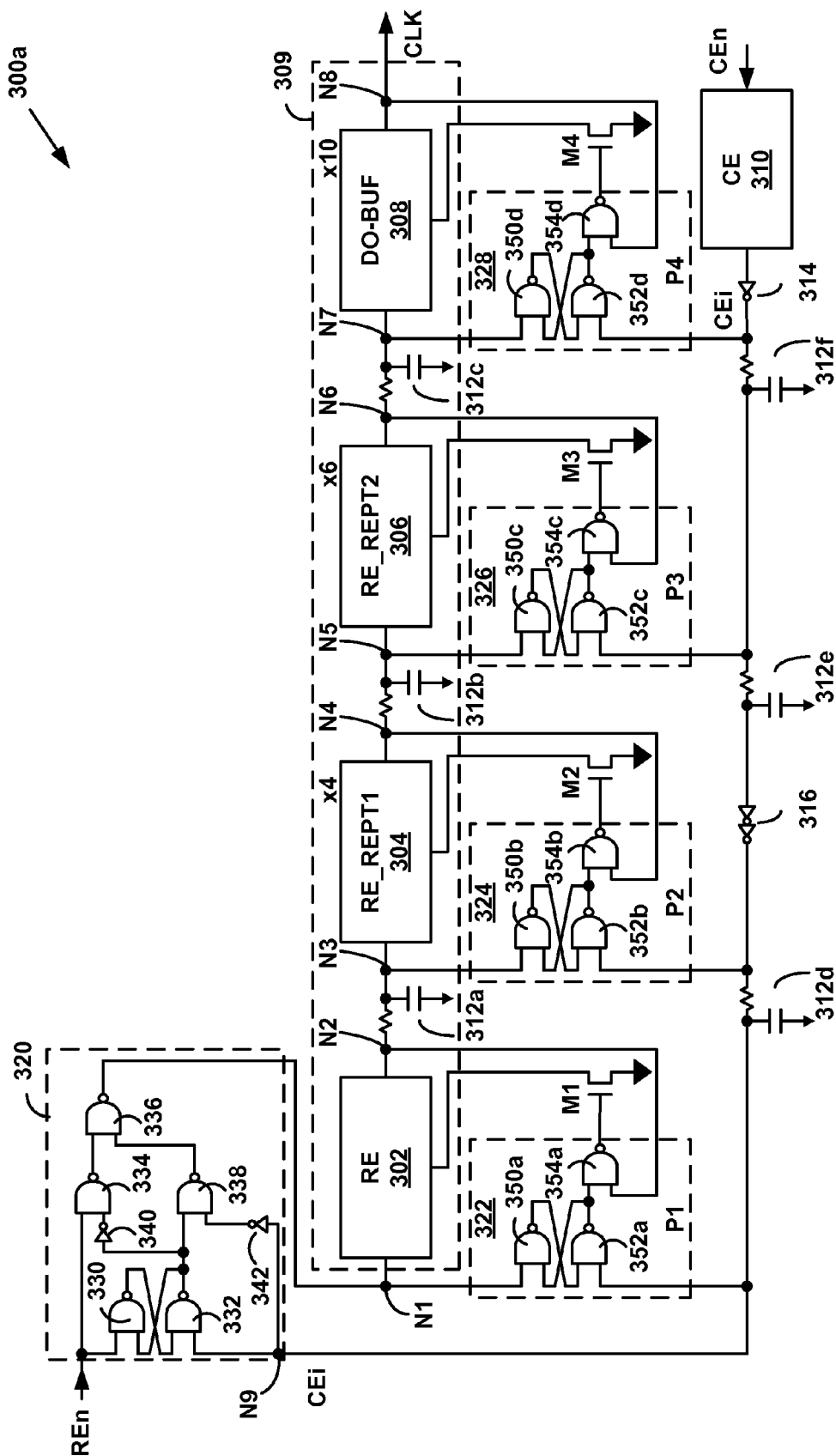
FIGS. 3A-3B are diagrams illustrating an I/O interface circuit of this technology.
Figure 3B:
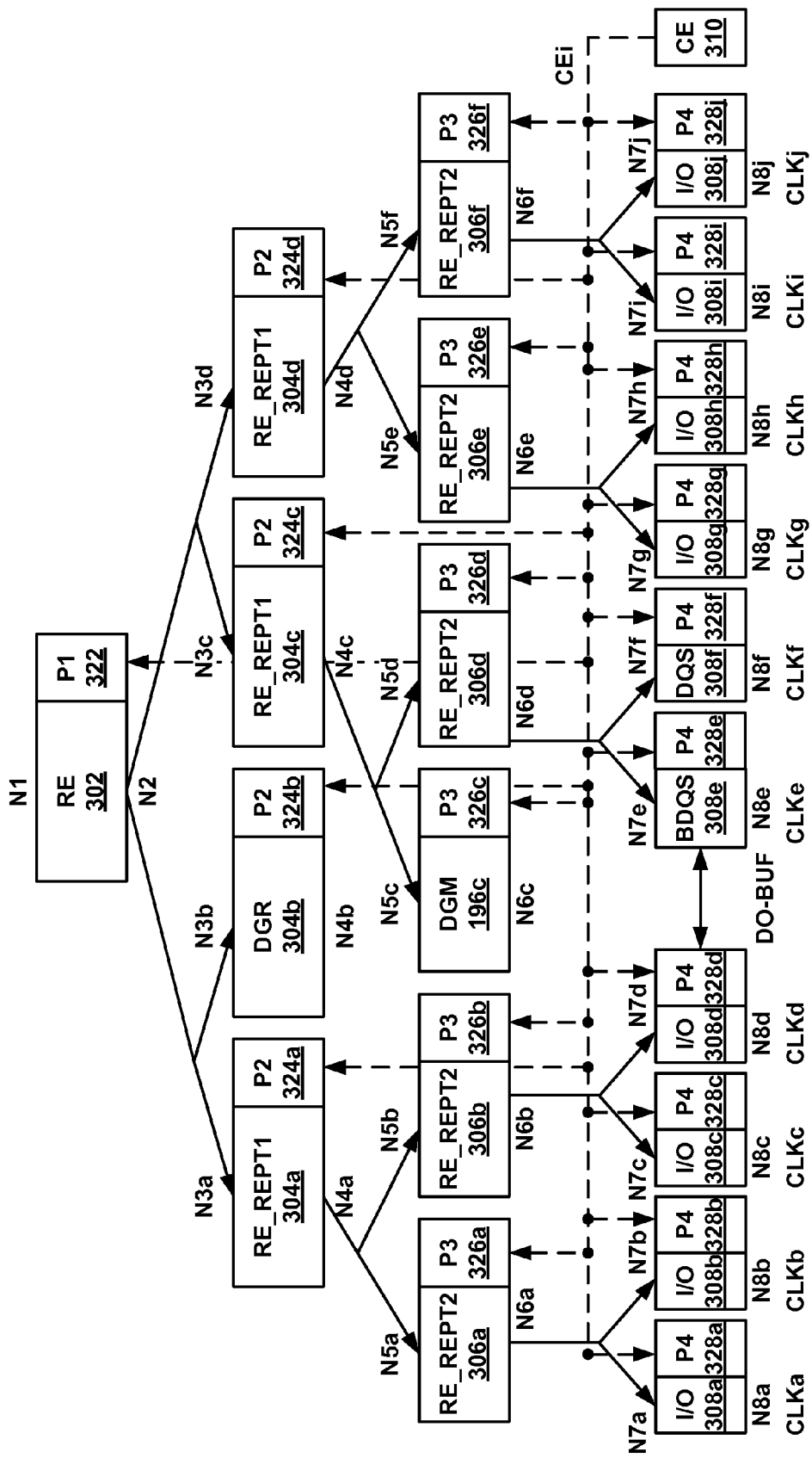

FIGS. 3A-3B are diagrams illustrating an embodiment of a read enable circuit 300a of this technology. Read enable circuit 300a receives a first control signal REn and a second control signal CEn and provides output clock signals CLK that provide data output timing to data output buffers (e.g., DQ0, DQ1, . . . DQ7, DQS and BDQS, not shown)

Read enable circuit 300a includes REn signal input buffer circuit 302, first repeater circuits 304a-304d, second repeater circuits 306a-306f, data output buffer circuits 308a-308j, and CEn signal input buffer circuit 310. In an embodiment, REn signal input buffer circuit 302, first repeater circuits 304a-304d, second repeater circuits 306a-306f, data output buffer circuits 308a-308j are fabricated using high speed transistors, and are collectively referred to herein as "high speed circuit block 309." Persons of ordinary skill in the art will understand that read enable circuit 300a may include more than one REn signal input buffer circuit 302, more or fewer than four first repeater circuits 304, more or fewer than six second repeater circuits 306, and more or fewer than ten data output buffer circuits 308.

Read enable circuit 300a also includes a control circuit 320, a first switch control circuit 322 (P1), second switch control circuits 324a-324d (P2), third switch control circuits 326a-326f (P3), fourth switch control circuits 328a-328j (P4), an inverter circuit 314, a buffer circuit 316 and power switch transistors M1, M2, M3 and M4. In an embodiment, CEn signal input buffer circuit 310, control circuit 320, first switch control circuit 322, second switch control circuits 324a-324d, third switch control circuits 326a-326f, fourth switch control circuits 328a-328j, inverter circuit 314, buffer circuit 316 and power switch transistors M1, M2, M3 and M4 are fabricated using nominal speed transistors, and are thus referred to herein as "nominal speed circuit blocks." Although not actual discrete circuit elements, read enable circuit 300a also includes conductor resistance and parasitic capacitances 312a-312f.

REn signal input buffer circuit 302 has a first node N1, a second node N2, and a first power node coupled to a drain terminal of power switch transistor M1. First node N1 is an input terminal of high speed circuit block 309. Each of first repeater circuits 304a-304d has a third node N3a-N3d, respectively, a fourth node N4a-N4d, respectively, and second power nodes coupled to a drain terminal of power switch transistor M2. In an embodiment, each of first repeater circuits 304a-304d has a corresponding second power node coupled to a drain terminal of a corresponding power switch transistor M2a-M2d, respectively (not shown).

Each of second repeater circuits 306a-306f has a fifth node N5a-N5f, a sixth node N6a-N6f, respectively, and third power nodes coupled to a drain terminal of power switch transistor M3. In an embodiment, each of second repeater circuits 306a-304f has a corresponding third power node coupled to a drain terminal of a corresponding power switch transistor M3a-M3f, respectively (not shown).

Each of data output buffer circuits 308a-308j has a seventh node N7a-N7j, respectively, an eighth node N8a-N8j, respectively, and fourth power nodes coupled to a drain terminal of power switch transistor M4. In an embodiment, each of data output buffer circuits 308a-308j has a corresponding fourth power node coupled to a drain terminal of a corresponding power switch transistor M4a-M4j, respectively (not shown). Data output buffer circuits 308a-308j provide clock signals CLKa-CLKj, respectively at eights nodes N8a-N8j, respectively. Nodes N8a-N8j comprise output terminals of high speed circuit block 309.

CEn signal input buffer circuit 310 provides a buffered version of CEn signal to inverter circuit 314, which provides an internal CE signal CEi. In an embodiment, buffer circuit 316 may be used to provide a buffered version of CEi signal (e.g., for driving long signal lengths). As depicted in the example layout of FIG. 3B, the signal traces for CEi (shown in dashed lines) are coupled to each of first switch control circuit 322, second switch control circuits 324a-324d, third switch control circuits 326a-326f, and fourth switch control circuits 328a-328j. However, for many embodiments, the signal timing of CEi is not critical, and the signal traces for CEi do not require matched lengths.

Control circuit 320 includes a first control circuit input terminal coupled to receive REn signal, a second control circuit input terminal coupled to receive CEi signal, and a control circuit output terminal coupled to first node N1. In an embodiment, control circuit 320 provides an output signal at first node N1 based on REn and CEi signals. In an embodiment, in standby mode when CEn is HIGH and CEi is LOW, the output signal of control circuit 320 is HIGH regardless of the value of REn. When CEn switches from HIGH to LOW in active mode, CEi switches from LOW to HIGH, and the output signal of control circuit 320 switches from HIGH to LOW. As will be described below, the LOW signal at node N1 propagates through high speed circuit block 309, such that outputs of each high speed circuit block goes LOW before the subsequent high speed circuit block is activated. While CEn remains LOW in active mode, CEi remains HIGH, and the output signal of control circuit 320 follows REn. When CEn switches from LOW to HIGH in standby mode, CEi switches from HIGH to LOW, and the output signal of control circuit 320 goes HIGH. As will be described below, the HIGH signal at node N1 propagates through the high speed circuit block 309, such that outputs of each block stage goes HIGH before the subsequent high speed circuit block is inactivated.

In an embodiment, control circuit 320 includes NAND gates 330-338, and inverter circuits 340-342. NAND gate 330 has a first input terminal coupled to the first terminal of control circuit 320, a second input terminal, and an output terminal. NAND gate 332 has a first input terminal coupled to the output terminal of NAND gate 330, a second input terminal coupled to the second terminal of control circuit 320, and an output terminal coupled to the second input terminal of NAND gate 330. NAND gate 334 has a first input terminal coupled to the first terminal of control circuit 320, a second input terminal, and an output terminal. NAND gate 336 has a first input terminal coupled to the output terminal of NAND gate 334, a second input terminal, and an output terminal coupled to the third terminal of control circuit 320. NAND gate 338 has a first input terminal coupled to the output terminal of NAND gate 332, a second input terminal, and an output terminal coupled to the second input terminal of NAND gate 336.

Inverter circuit 340 has an input terminal coupled to the output terminal of NAND gate 332 and the first input terminal of NAND gate 338, and an output terminal coupled to the second input terminal of NAND gate 334. Inverter circuit 342 has an input terminal coupled to the second terminal of control circuit 320, and an output terminal coupled to the second input terminal of NAND gate 338.

Each of first switch control circuit 322, second switch control circuits 324a-324d, third switch control circuits 326a-326f, and fourth switch control circuits 328a-328j has a first input terminal, a second input terminal, a third input terminal and an output terminal. As described in more detail below, first switch control circuit 322 turns ON and OFF power switch transistor M1, second switch control circuits 324a-324d turn ON and OFF power switch transistor M2a-M2d, respectively, third switch control circuits 326a-326f turn ON and OFF power switch transistor M3a-M3f, respectively, and fourth switch control circuits 328a-328j turn ON and OFF power switch transistor M4a-M4j, respectively.

In particular, first switch control circuit 322 has a first switch control input terminal coupled to first node N1, a second switch control input terminal coupled to receive CEi signal, a third switch control input terminal coupled to second node N2, and a switch control output terminal coupled to a gate terminal of power switch transistor M1, which has a source terminal coupled to a negative power supply terminal. First switch control circuit 322 includes NAND gates 350a, 352a, and 354a.

NAND gate 350a has a first input terminal coupled to the first input terminal of first switch control circuit 322, a second input terminal, and an output terminal. NAND gate 352a has a first input terminal coupled to the output terminal of NAND gate 350a, a second input terminal coupled to the second input terminal of first switch control circuit 322, and an output terminal coupled to the second input terminal of NAND gate 350a. NAND gate 354a has a first input terminal coupled to the output terminal of NAND gate 352a and the second input terminal of NAND gate 350a, a second input terminal coupled to the third input terminal of first switch control circuit 322, and an output terminal coupled to the output terminal of first switch control circuit 322.

Second switch control circuits 324a-324d each have a first switch control input terminal coupled to third node N3, a second switch control input terminal coupled to receive CEi signal, a third switch control input terminal coupled to fourth node N4, and a switch control output terminal coupled to a gate terminal of a corresponding power switch transistor M2a-M2d, each of which has a source terminal coupled to a negative power supply terminal. By way of example, second switch control circuit 324a includes NAND gates 350b, 352b, and 354b.

NAND gate 350b has a first input terminal coupled to the first input terminal of second switch control circuit 324a, a second input terminal, and an output terminal. NAND gate 352b has a first input terminal coupled to the output terminal of NAND gate 350b, a second input terminal coupled to the second input terminal of second switch control circuit 324a, and an output terminal coupled to the second input terminal of NAND gate 350b. NAND gate 354b has a first input terminal coupled to the output terminal of NAND gate 352b and the second input terminal of NAND gate 350b, a second input terminal coupled to the third input terminal of second switch control circuit 324a, and an output terminal coupled to the output terminal of second switch control circuit 324a.

Third switch control circuits 326a-326f each have a first switch control input terminal coupled to fifth node N5, a second switch control input terminal coupled to receive CEi signal, a third switch control input terminal coupled to sixth node N6, and a switch control output terminal coupled to a gate terminal of a corresponding power switch transistor M3a-M3f, each of which has a source terminal coupled to a negative power supply terminal. By way of example, third switch control circuit 326a includes NAND gates 350c, 352c, and 354c.

NAND gate 350c has a first input terminal coupled to the first input terminal of third switch control circuit 326a, a second input terminal, and an output terminal. NAND gate 352c has a first input terminal coupled to the output terminal of NAND gate 350c, a second input terminal coupled to the second input terminal of third switch control circuit 326a, and an output terminal coupled to the second input terminal of NAND gate 350c. NAND gate 354c has a first input terminal coupled to the output terminal of NAND gate 352c and the second input terminal of NAND gate 350c, a second input terminal coupled to the third input terminal of third switch control circuit 326a, and an output terminal coupled to the output terminal of third switch control circuit 326a.

Fourth switch control circuits 328a-328j each have a first switch control input terminal coupled to seventh node N7, a second switch control input terminal coupled to receive CEi signal, a third switch control input terminal coupled to eighth node N8, and a switch control output terminal coupled to a gate terminal of a corresponding power switch transistor M4a-M4j, each of which has a source terminal coupled to a negative power supply terminal. By way of example, fourth switch control circuit 328a includes NAND gates 350d, 352d, and 354d.

NAND gate 350d has a first input terminal coupled to the first input terminal of fourth switch control circuit 328a, a second input terminal, and an output terminal. NAND gate 352d has a first input terminal coupled to the output terminal of NAND gate 350d, a second input terminal coupled to the second input terminal of fourth switch control circuit 328a, and an output terminal coupled to the second input terminal of NAND gate 350d. NAND gate 354d has a first input terminal coupled to the output terminal of NAND gate 352d and the second input terminal of NAND gate 350d, a second input terminal coupled to the third input terminal of fourth switch control circuit 328a, and an output terminal coupled to the output terminal of fourth switch control circuit 328a.

Figure 3E:
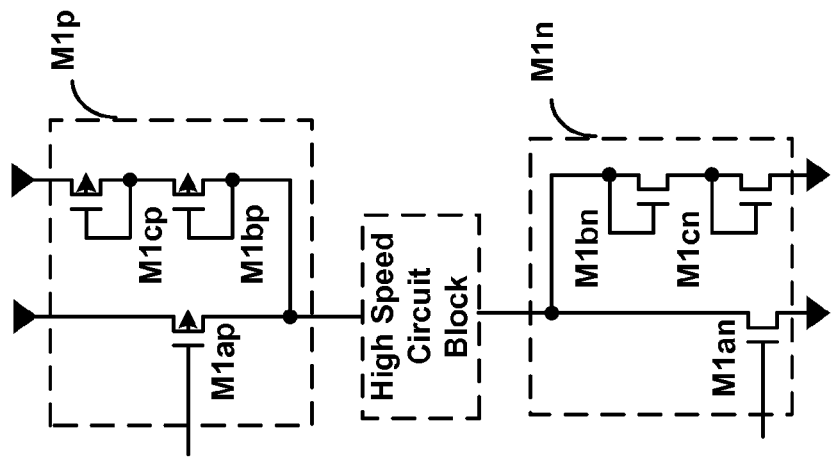
FIGS. 3C-3E are diagrams of example power switch transistors for the I/O interface circuit of FIGS. 3A-3B.
Figure 3D:
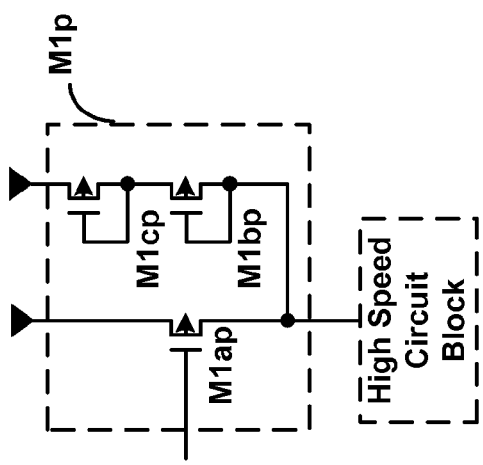
Figure 3C:
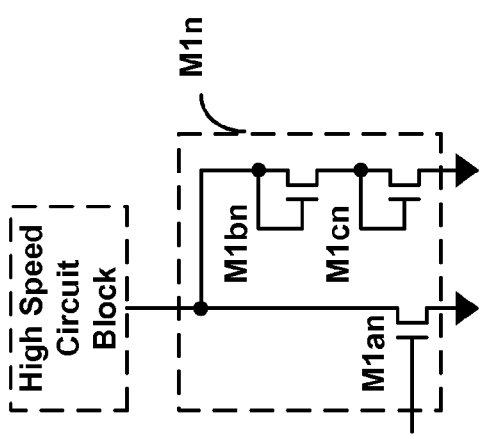

Each of power switch transistors M1, M2a-M2d, M3a-M3f, and M4a-M4j may include one or more transistors. FIG. 3C is a diagram of an example power switch transistor (e.g., M1n) that may be used to connect and disconnect a high speed circuit from a negative supply terminal (e.g., VSS). Power switch transistor M1n includes a first n-channel transistor M1an in parallel with two diode-connected n-channel transistors M1bn and M1cn which form a voltage clamp which clamps the drain terminal of first transistor M1an at 2×Vthn, where Vthn is the threshold voltage of each of transistors M1bn and M1cn. Including such voltage clamps may increase the wakeup speed of REn signal input buffer circuit 302, first repeater circuits 304a-304d, second repeater circuits 306a-306f, data output buffer circuits 308a-308j.

Persons of ordinary skill in the art will understand that power switch transistors alternatively may be used to disconnected high speed circuits from a positive power supply terminal. FIG. 3D is a diagram of an example power switch transistor (e.g., M1p) that may be used to connect and disconnect a high speed circuit from a positive power supply terminal (e.g., VDD). Power switch transistor M1p includes a first p-channel transistor M1ap in parallel with two diode-connected p-channel transistors M1bp and M1cp which form a voltage clamp which clamps the drain terminal of first transistor M1ap at (VDD−2×Vthp), where Vthp is the threshold voltage of each of transistors M1bp and M1cp.

Persons of ordinary skill in the art will understand that power switch transistors alternatively may be used to disconnected high speed circuits from both positive and negative power supply terminals. FIG. 3E is a diagram of example power switch transistors M1p and M1n that may be used to connect and disconnect a high speed circuit from a positive power supply terminal (e.g., VDD) and a negative power supply terminal (e.g., VSS), respectively.

In an embodiment, as will be described below, in standby mode when CEn is HIGH and CEi is LOW, the output signal of control circuit 320 is HIGH, the outputs of first switch control circuit 322, second switch control circuits 324a-324d, third switch control circuits 326a-326f, and fourth switch control circuits 328a-328j are all LOW, power switch transistors M1, M2a-M2d, M3a-M3f, and M4a-M4j are all OFF, and REn signal input buffer circuit 302, first repeater circuits 304a-304d, second repeater circuits 306a-306f, data output buffer circuits 308a-308j are all inactive.

When CEn switches from HIGH to LOW in active mode, CEi switches from LOW to HIGH, and the output signal of control circuit 320 switches from HIGH to LOW. As will be described in more detail below, the LOW signal at node N1 propagates through each stage of high speed circuit block 309, and first switch control circuit 322, second switch control circuits 324a-324d, third switch control circuits 326a-326f, and fourth switch control circuits 328a-328j activate REn signal input buffer circuit 302, first repeater circuits 304a-304d, second repeater circuits 306a-306f, and data output buffer circuits 308a-308j in a first predetermined order.

When CEn switches from LOW to HIGH in standby mode, CEi switches from HIGH to LOW, and the output signal of control circuit 320 goes HIGH. As will be described below, the HIGH signal at node N1 propagates through the high speed circuit block 309, and first switch control circuit 322, second switch control circuits 324a-324d, third switch control circuits 326a-326f, and fourth switch control circuits 328a-328j inactivate REn signal input buffer circuit 302, first repeater circuits 304a-304d, second repeater circuits 306a-306f, and data output buffer circuits 308a-308j in a second predetermined order.

Figure 4A:
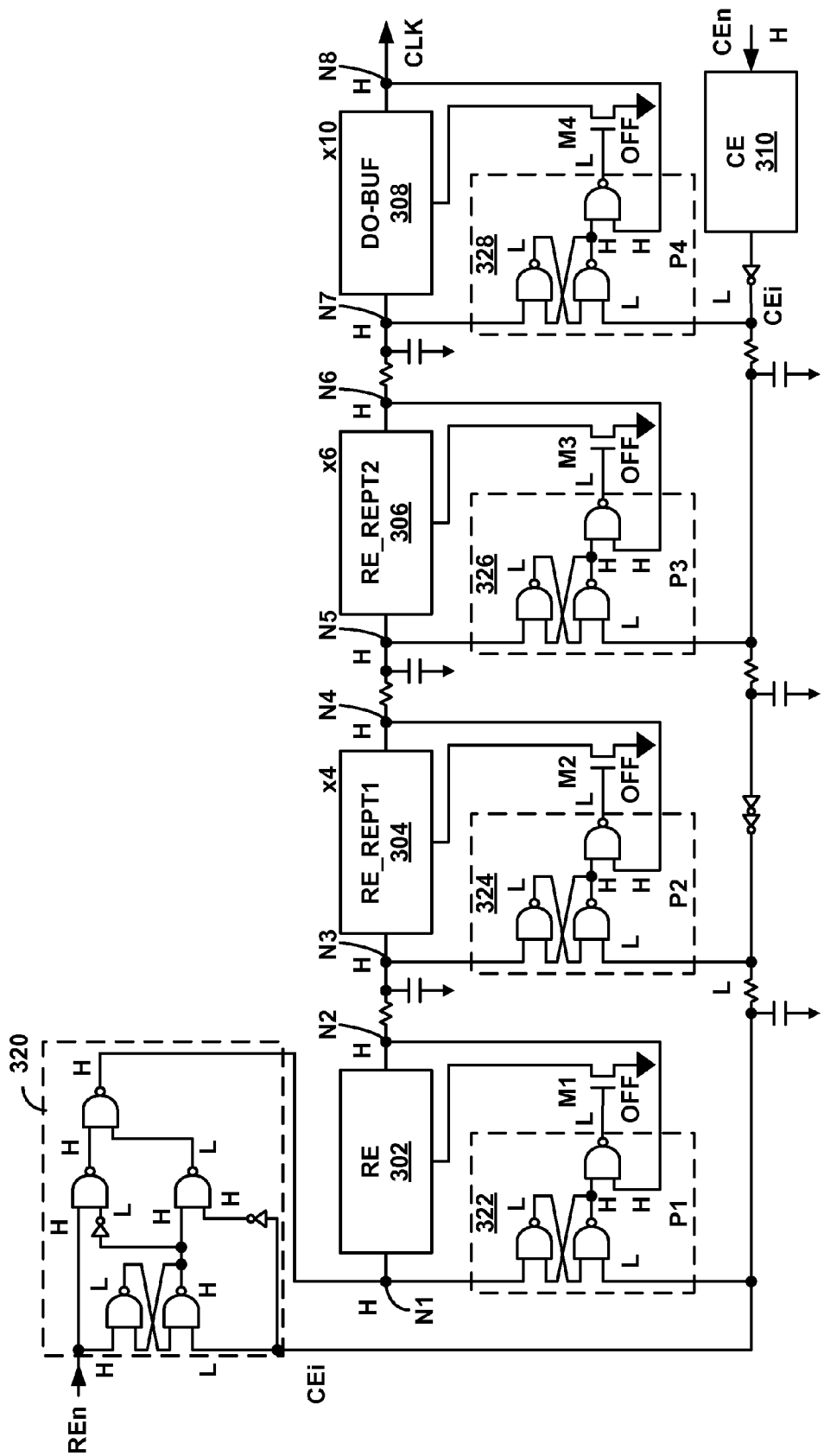
FIGS. 4A-4O are diagrams of an example operation of the I/O interface circuit of FIGS. 3A-3B.
Figure 4B:
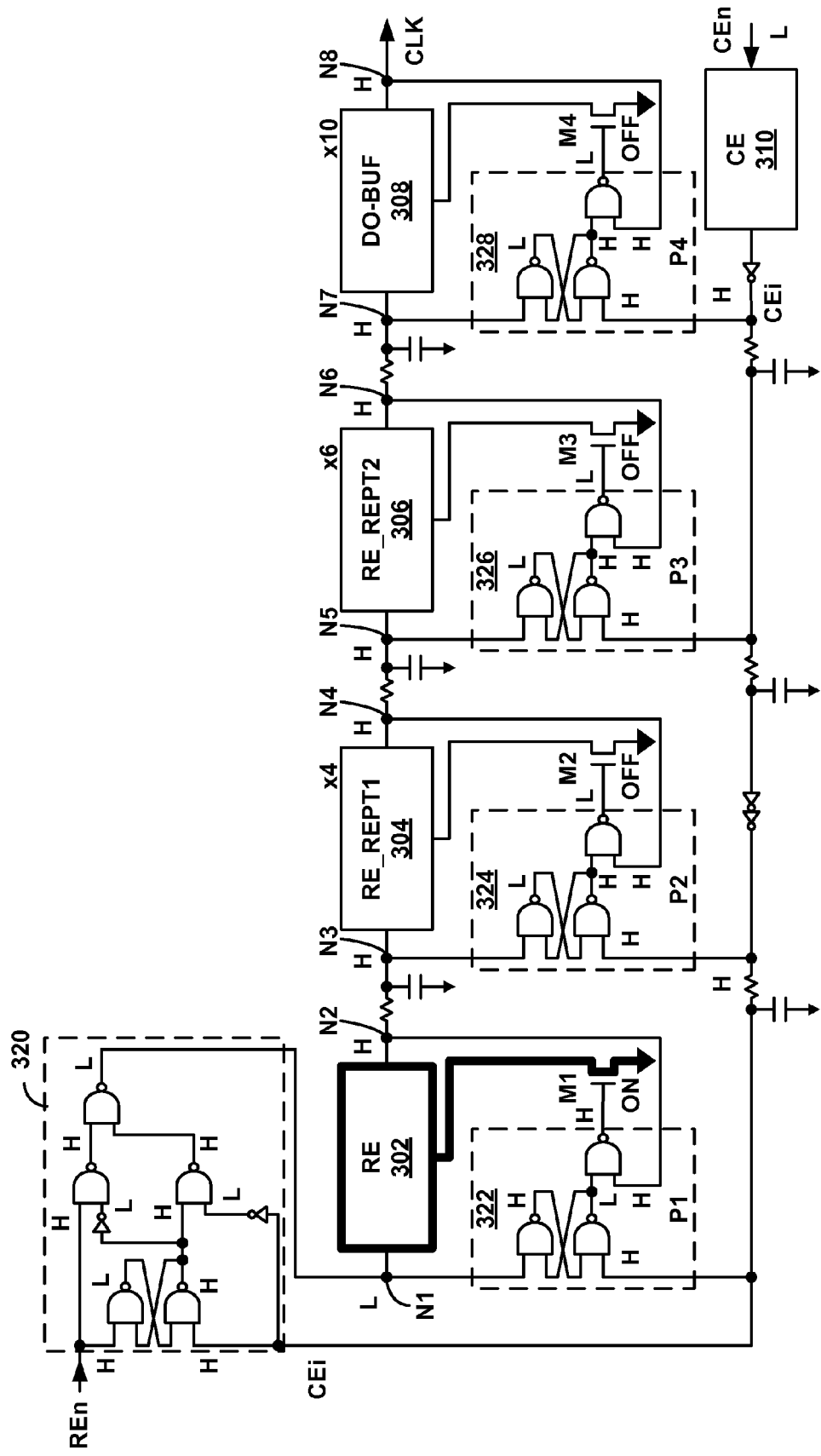
Figure 4C:
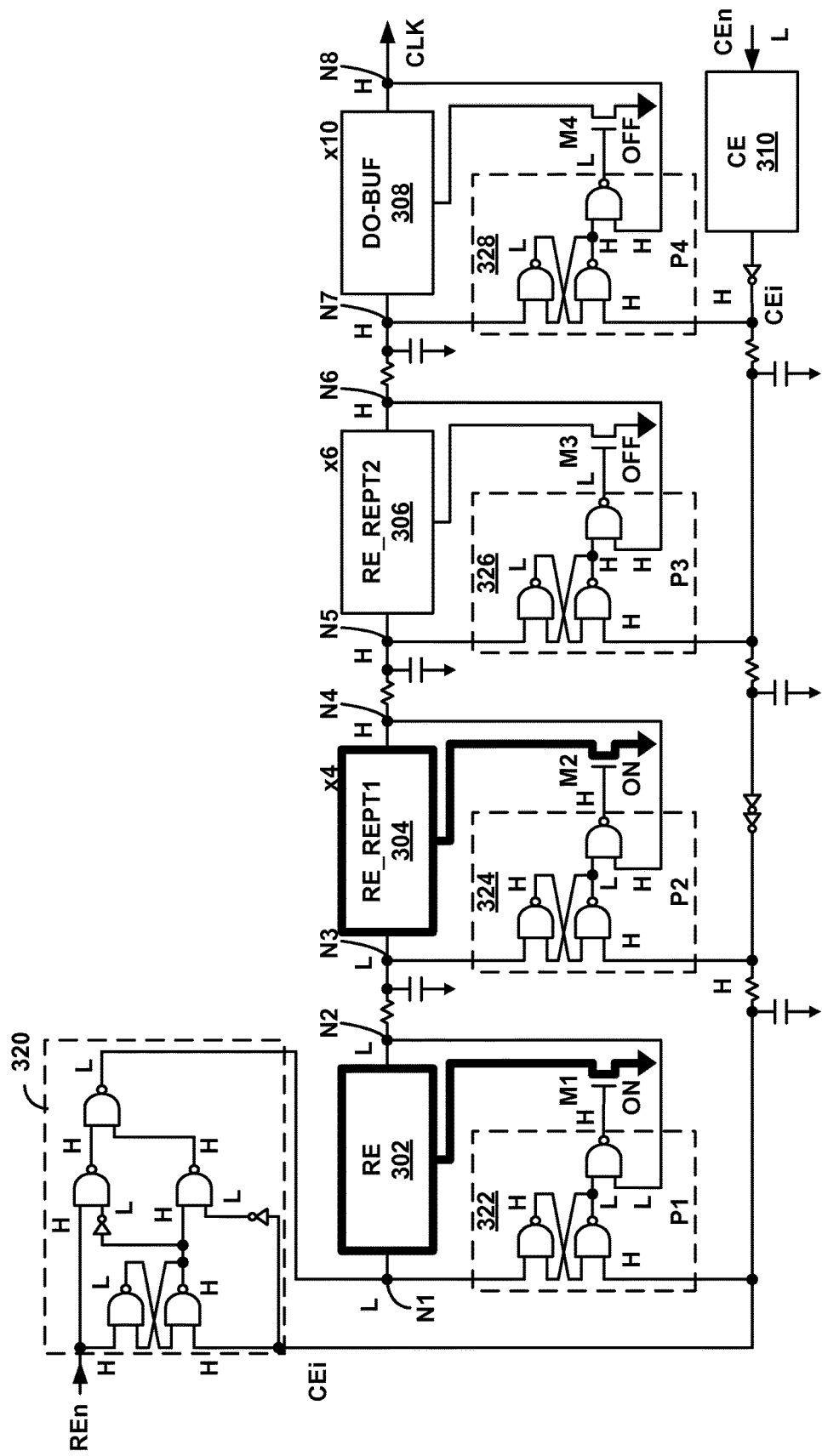
Figure 4D:
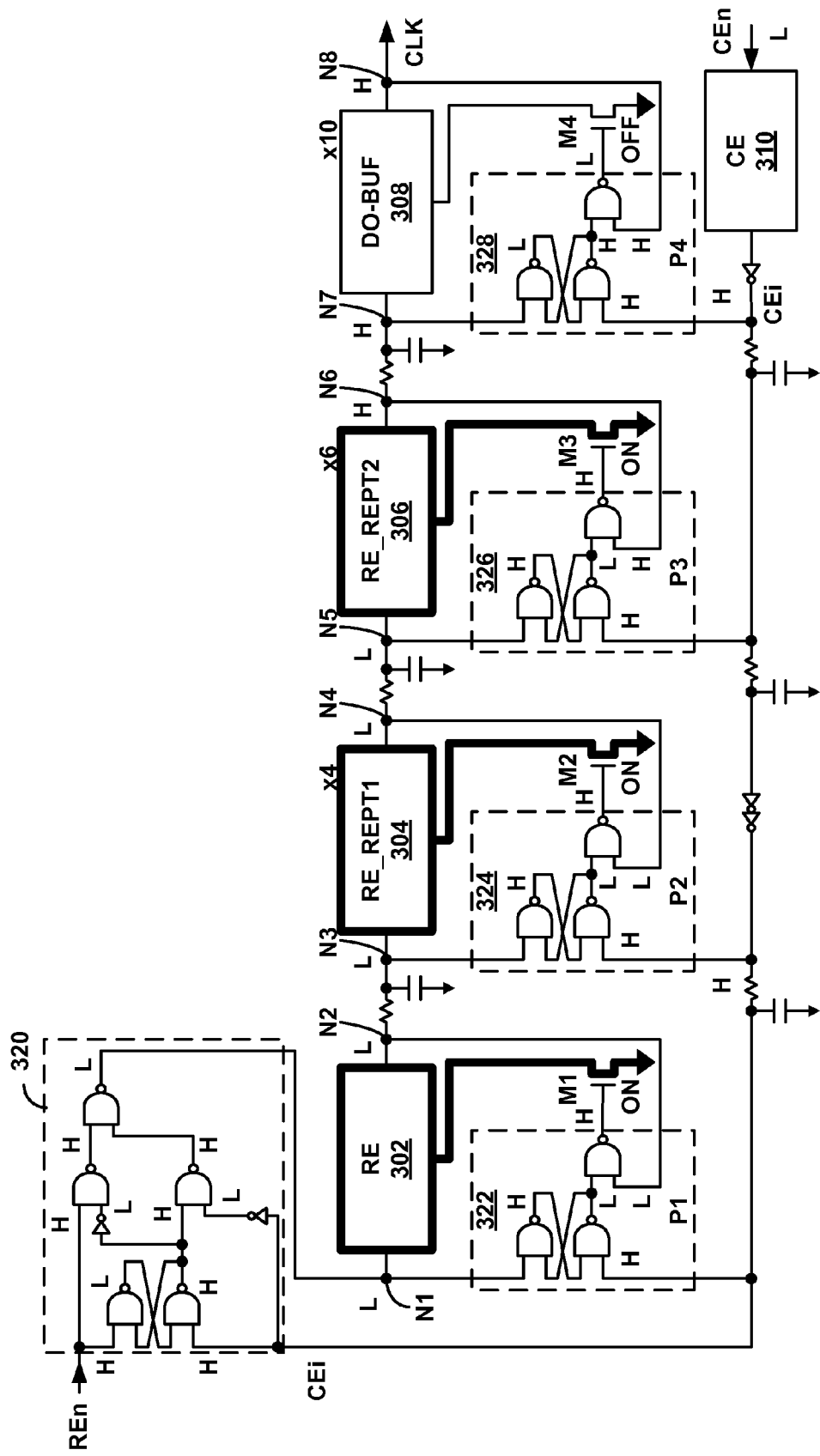
Figure 4E:
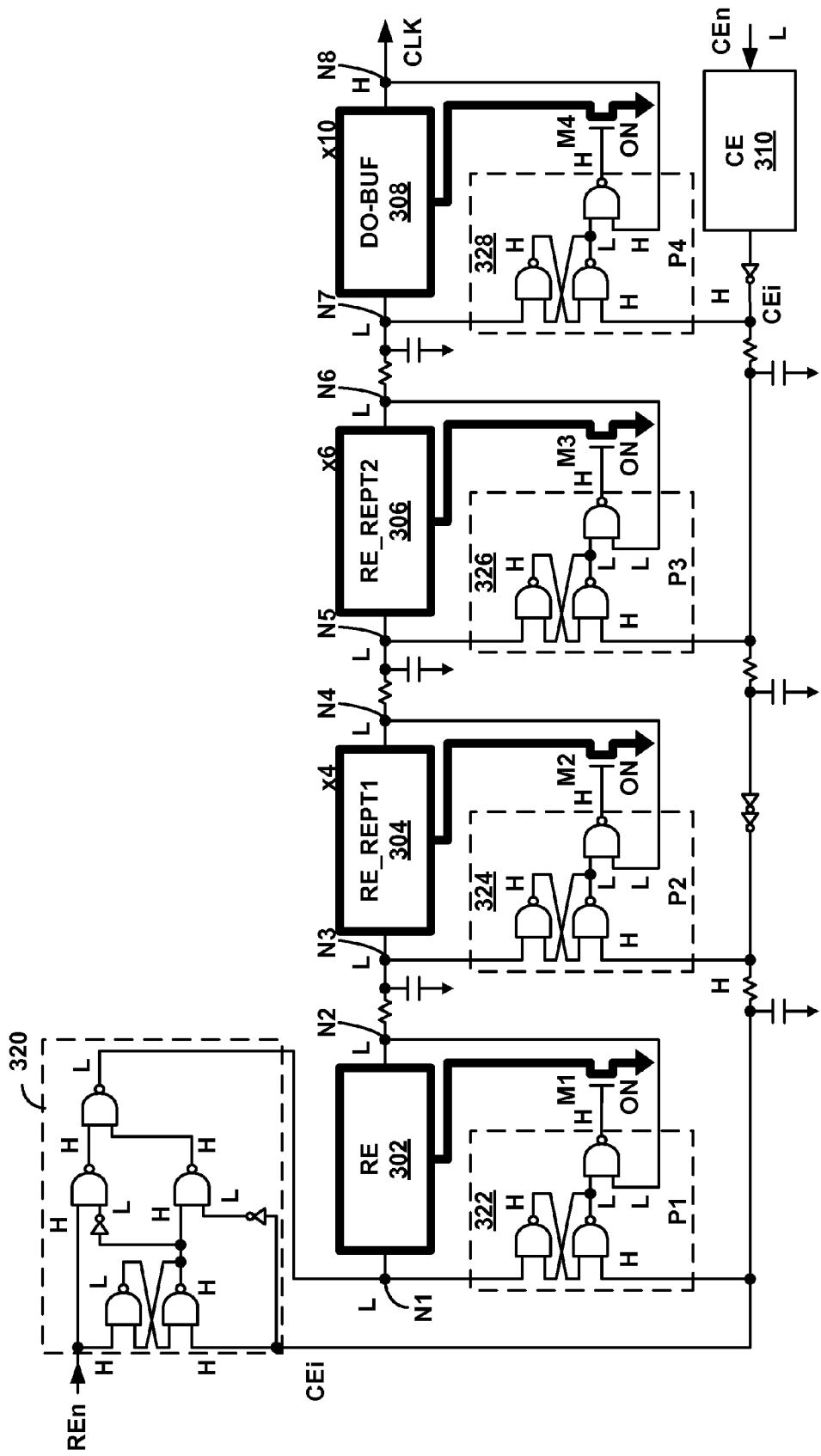
Figure 4F:
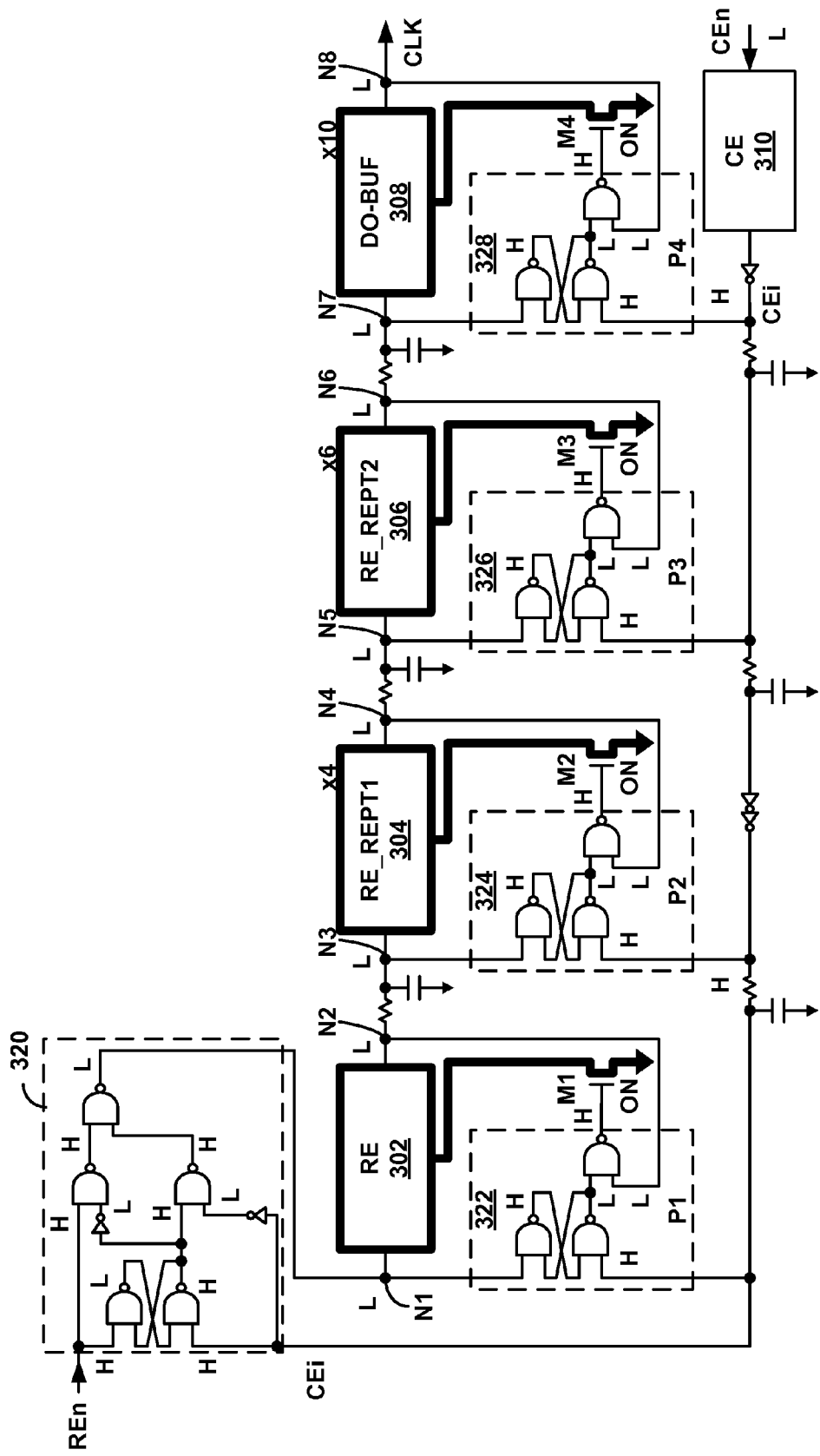
Figure 4G:
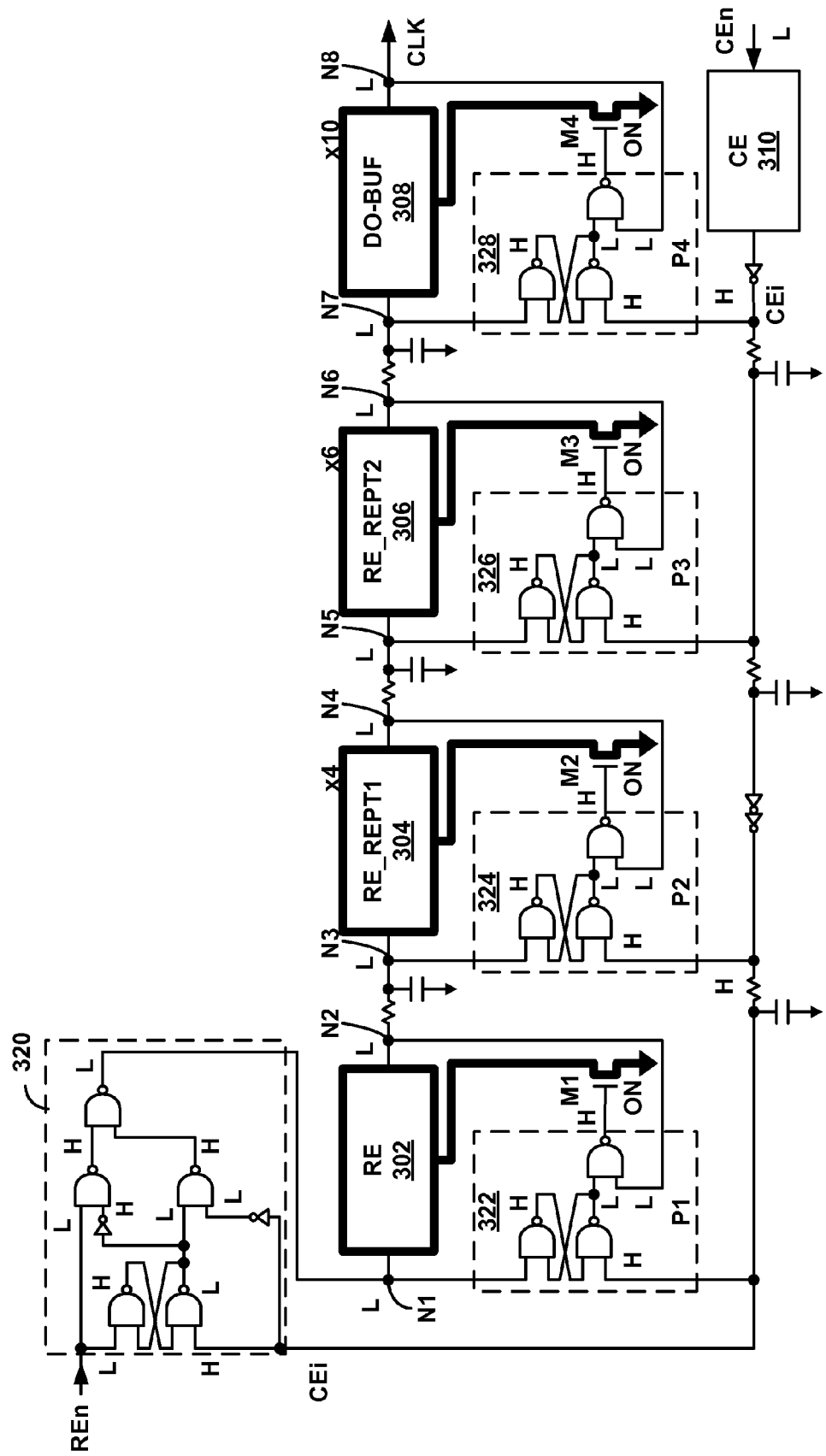
Figure 4H:
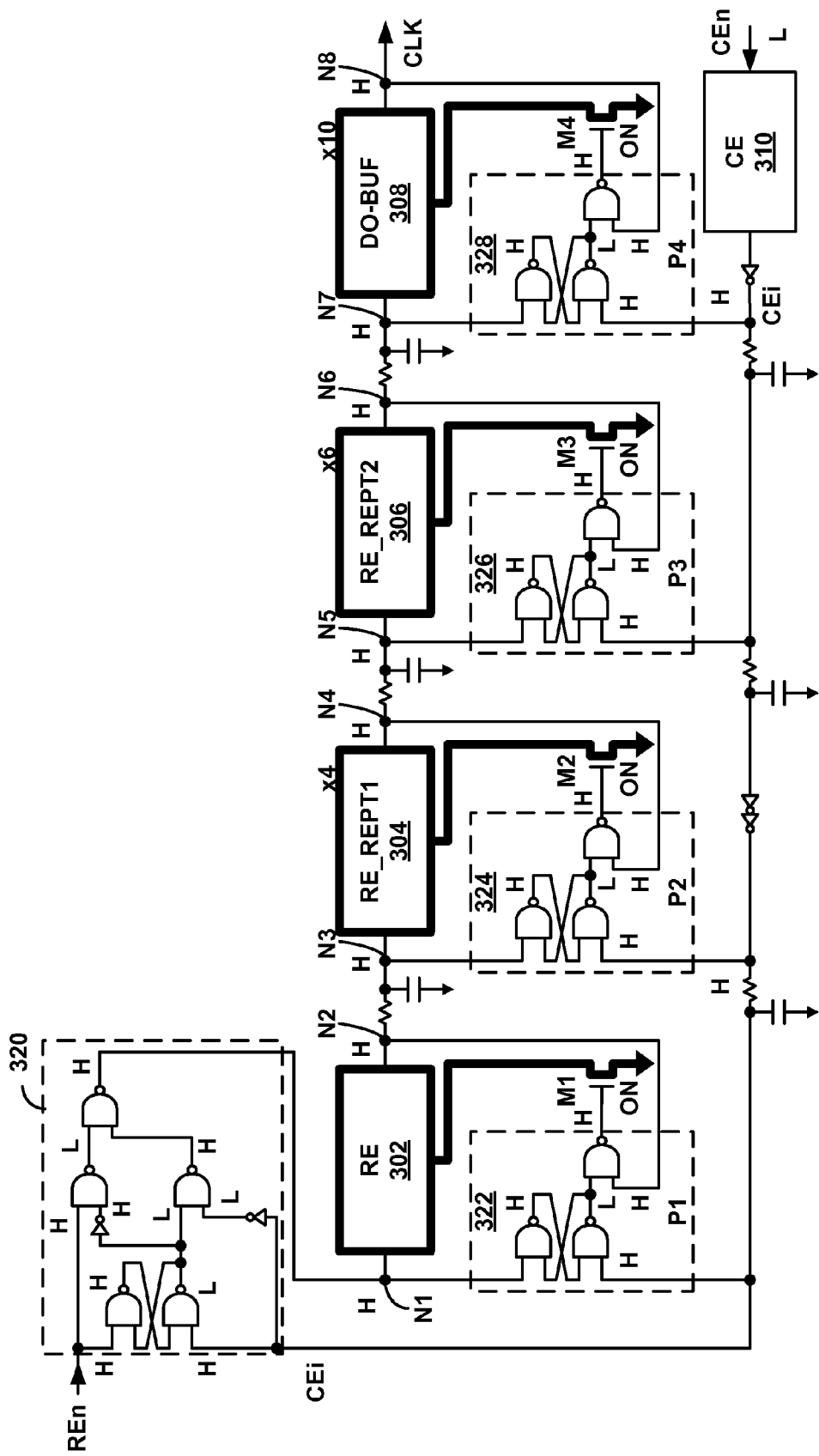
Figure 4I:
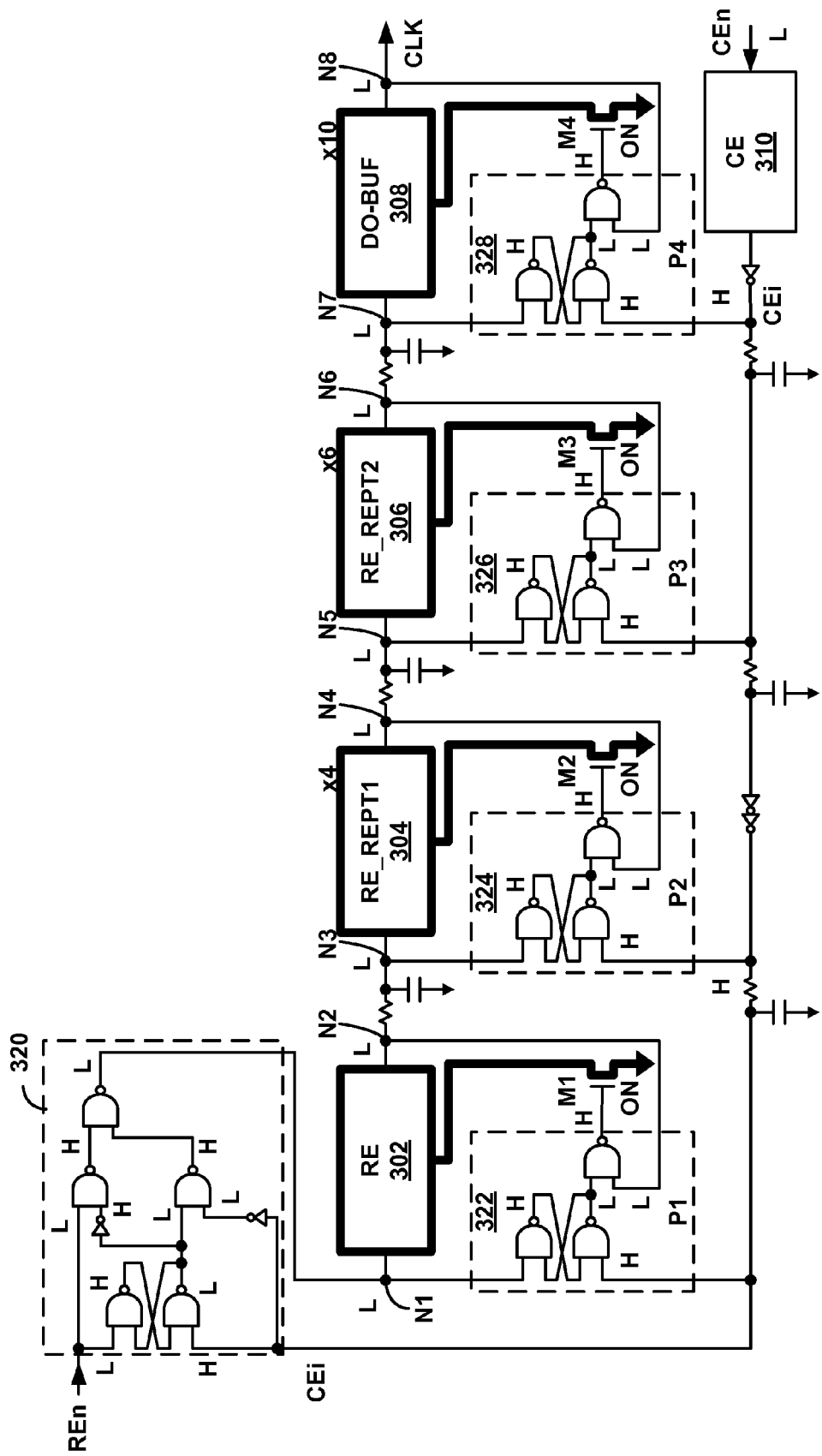
Figure 4J:
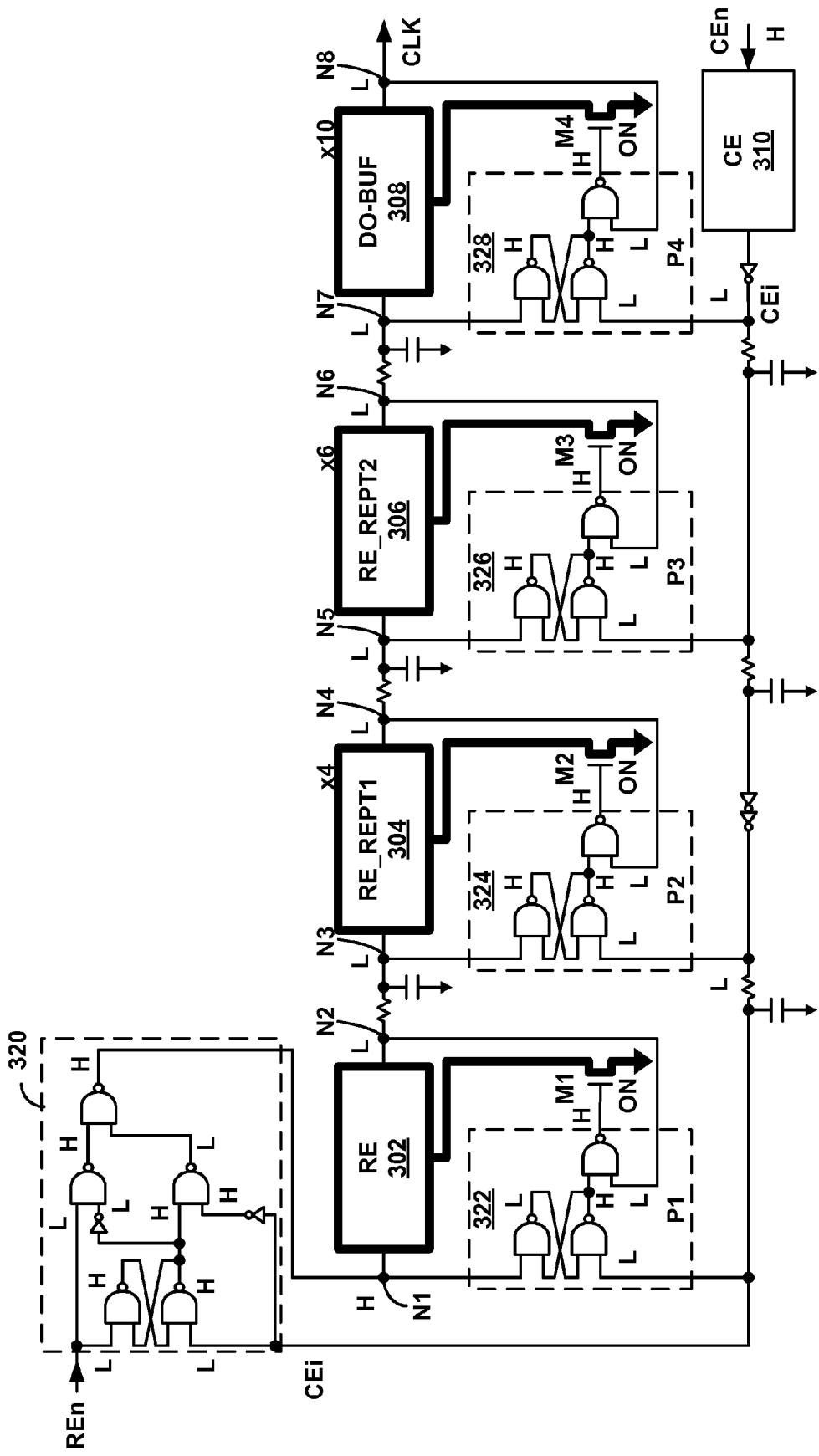
Figure 4K:
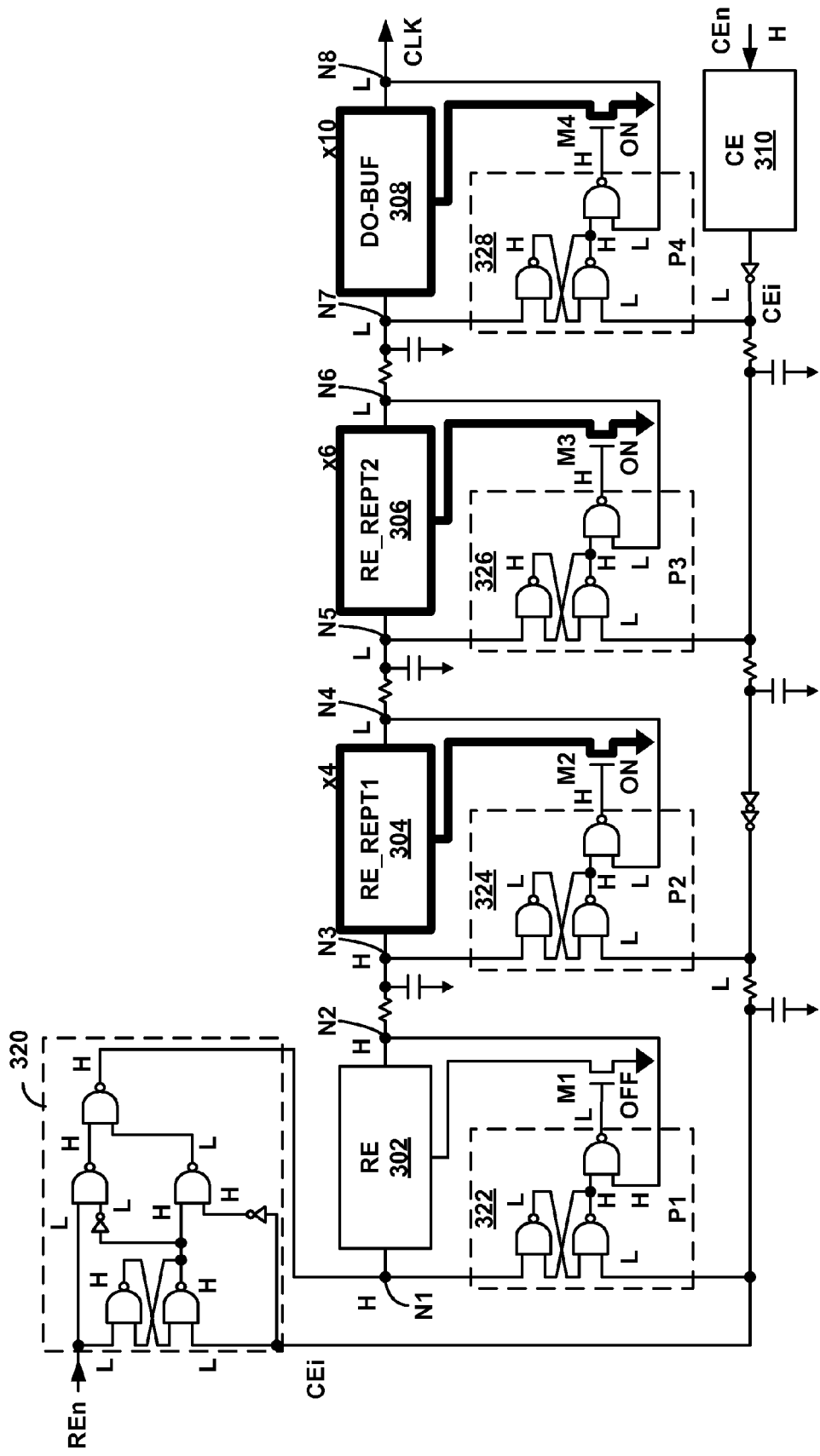
Figure 4L:
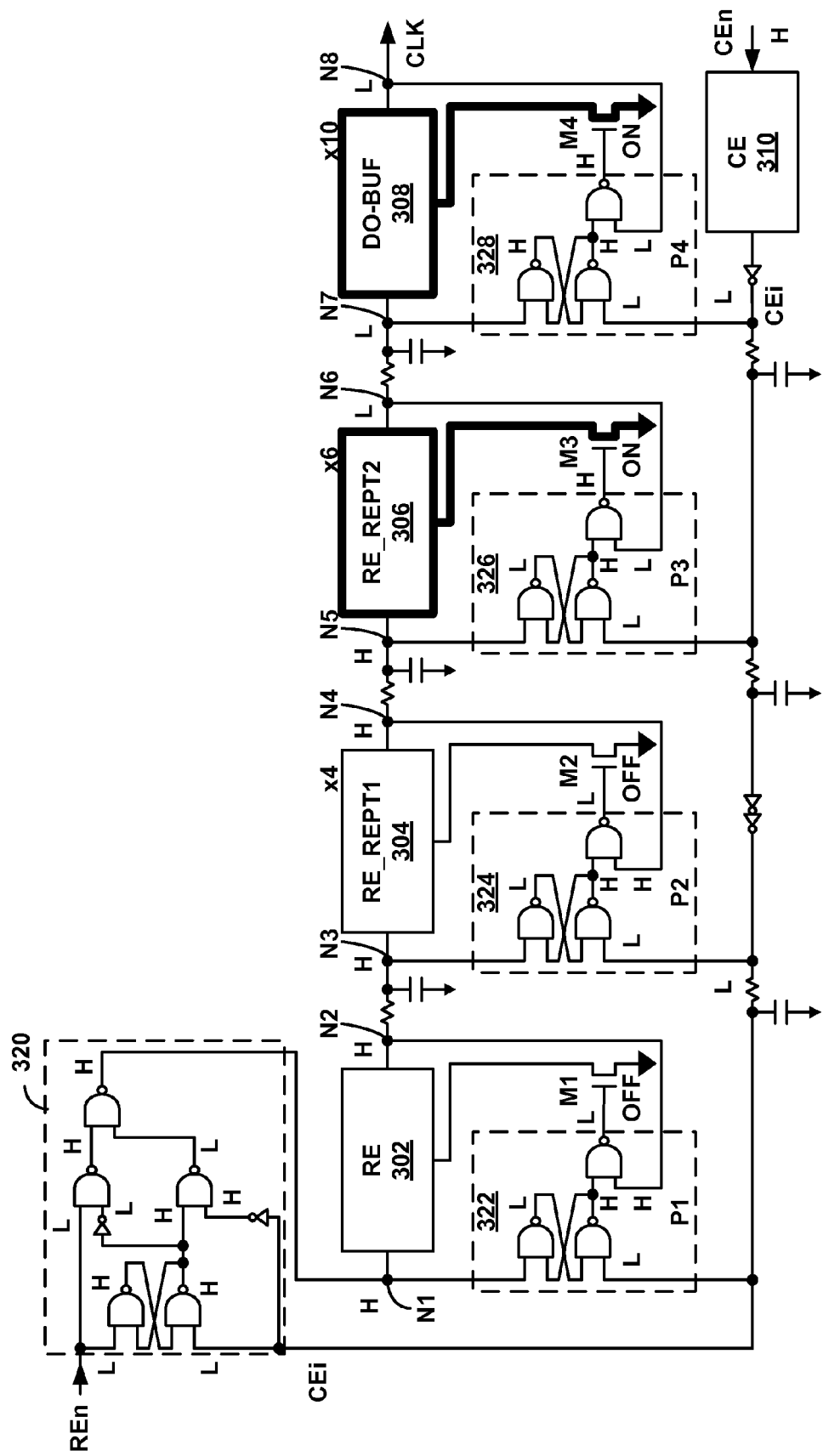
Figure 4M:
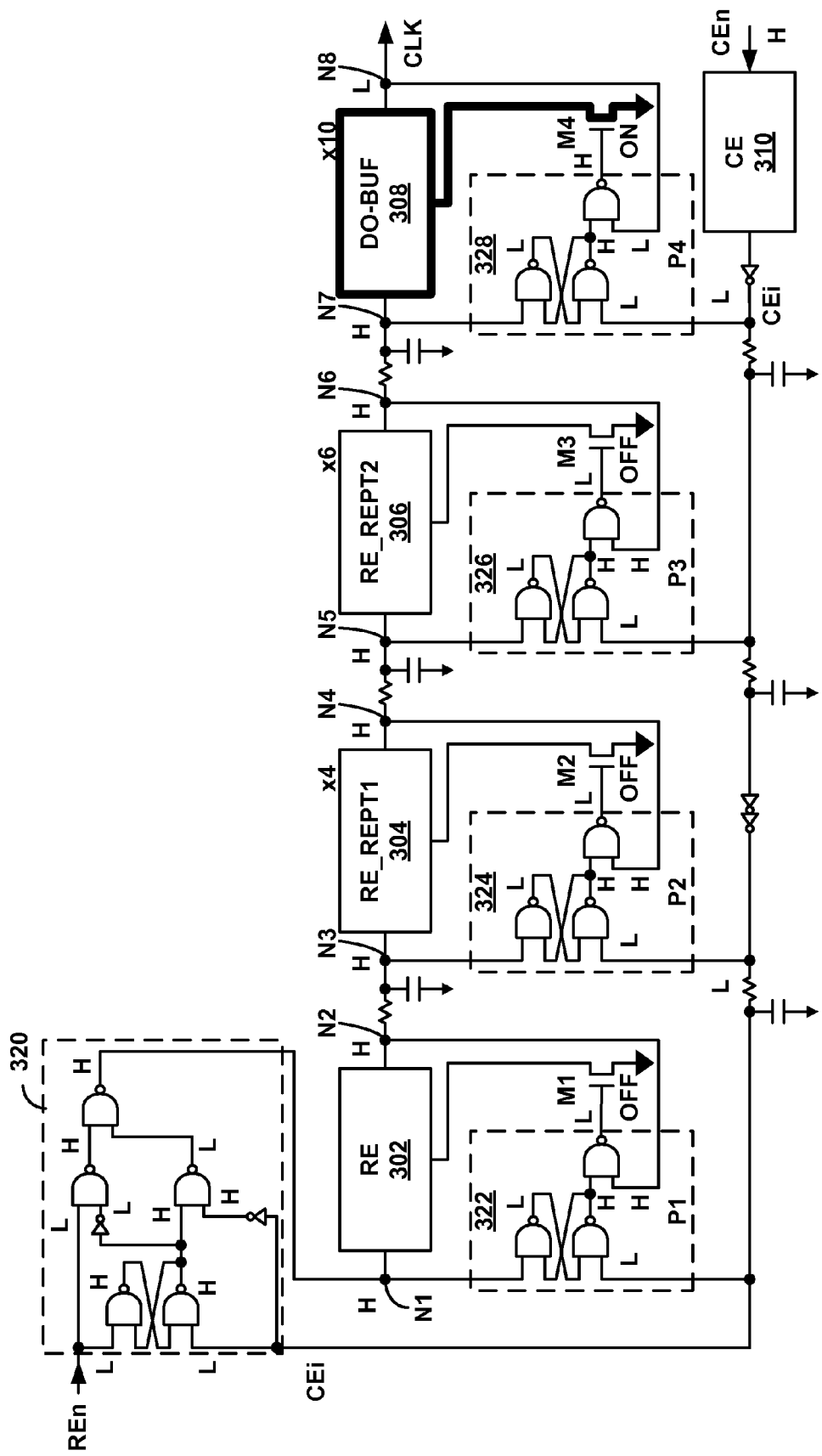
Figure 4N:
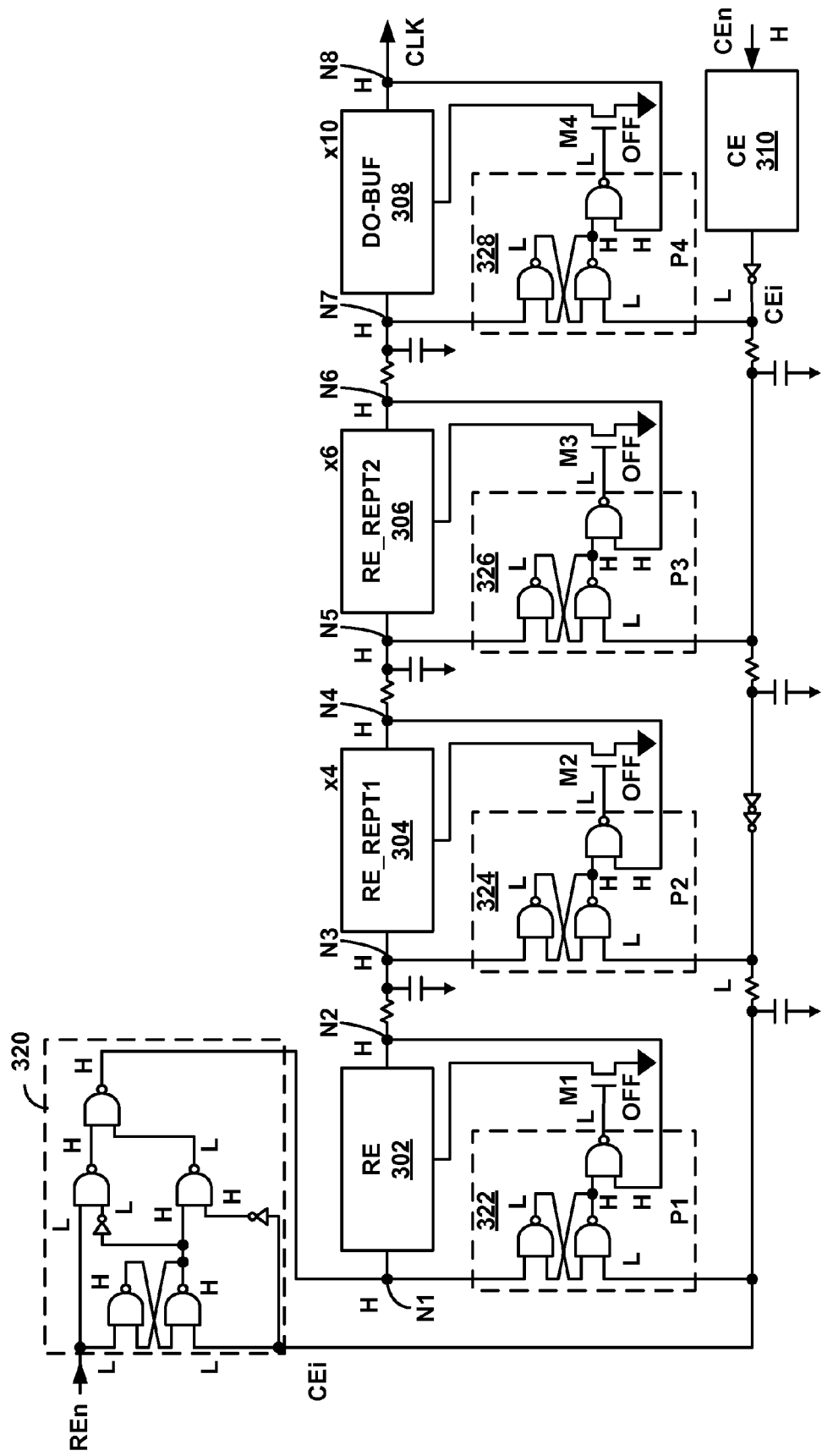
Figure 4O:
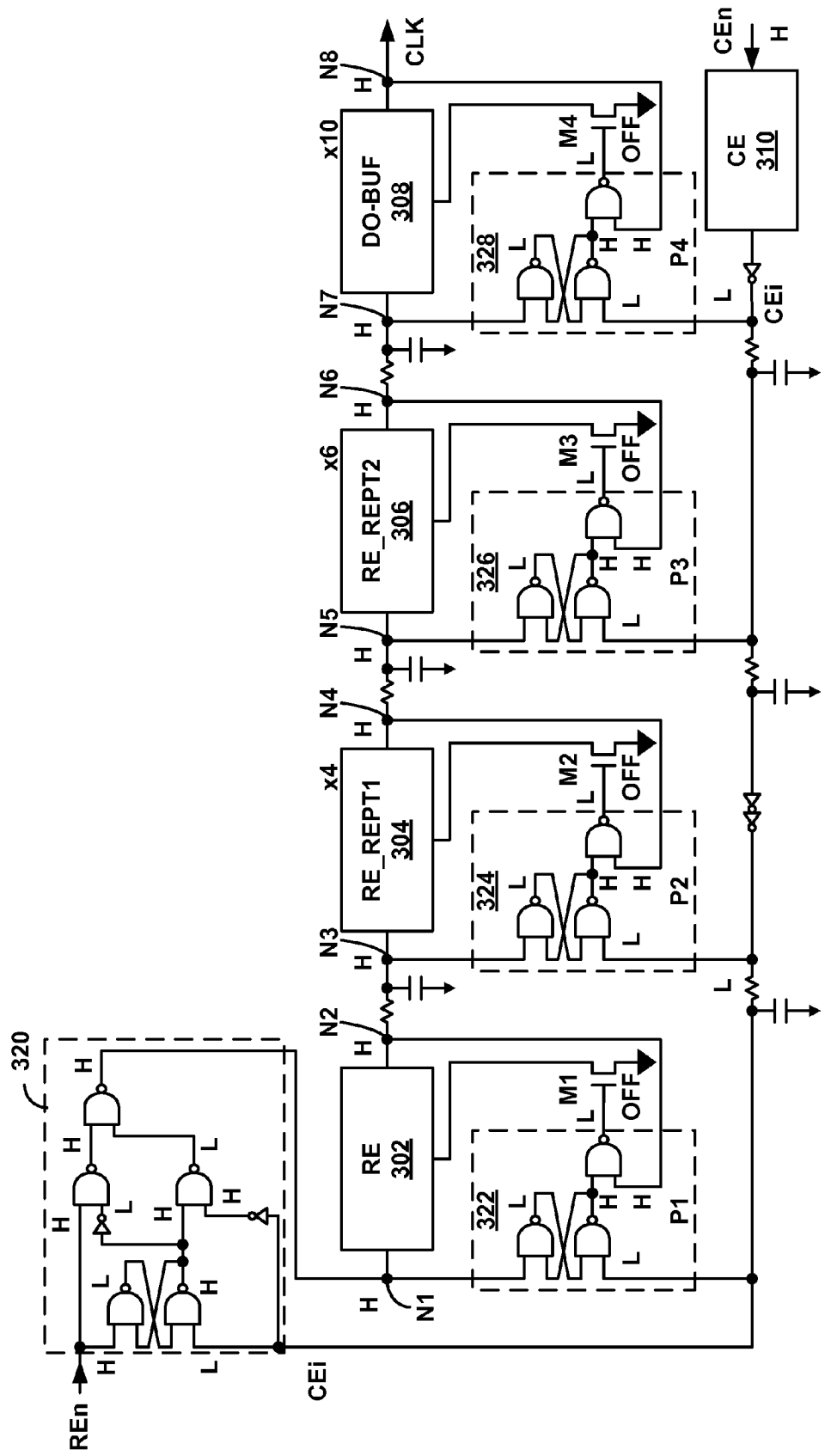

FIGS. 4A-4O illustrate an example operation of read enable circuit 300a. To avoid over-cluttering the drawings, various reference numbers have been omitted. FIG. 4A illustrates read enable circuit 300a in a first standby state, referred to herein as "standby state 0." In particular, CEn is HIGH, CEi is LOW, REn is HIGH, the output of control circuit 320 at node N1 is HIGH, the output of REn signal input buffer circuit 302 at node N2 is HIGH, the outputs of each of first repeater circuits 304a-304d at nodes N4a-N4d, respectively, are all HIGH, the outputs of each of second repeater circuits 306a-306f at nodes N6a-N6f, respectively are all HIGH, and the outputs CLKa-CLKj of data output buffer circuits 308a-308j at nodes N8a-N8j, respectively, are all HIGH.

In addition, the outputs of first switch control circuit 322, second switch control circuits 324a-324d, third switch control circuits 326a-326f, fourth switch control circuits 328a-328j are all LOW, and power switch transistors M1, M2a-M2d, M3a-M3f, and M4a-M4j are all OFF. As a result, REn signal input buffer circuit 302, first repeater circuits 304a-304d, second repeater circuits 306a-306f and data output buffer circuits 308a-308j are all disconnected from negative supply VSS and are all inactive. Thus, in standby state 0, CEn is HIGH, the high speed circuits blocks (REn signal input buffer circuit 302, first repeater circuits 304a-304d, second repeater circuits 306a-306f and data output buffer circuits 308a-308j) are all inactive, clock signals CLKa-CLKj are all HIGH, and CEn has control of read enable circuit 300a.

FIG. 4B illustrates read enable circuit 300a in a first active state, referred to herein as "active state 0." In particular, CEn is LOW, CEi is HIGH, REn is HIGH, the output of control circuit 320 at node N1 is LOW, the output of REn signal input buffer circuit 302 at node N2 is HIGH, the outputs of each of first repeater circuits 304a-304d at nodes N4a-N4d, respectively, are all HIGH, the outputs of each of second repeater circuits 306a-306f at nodes N6a-N6f, respectively are all HIGH, and the outputs CLKa-CLKj of data output buffer circuits 308a-308j at nodes N8a-N8j, respectively, are all HIGH.

The output of first switch control circuit 322 is HIGH, and the outputs of second switch control circuits 324a-324d, third switch control circuits 326a-326f, fourth switch control circuits 328a-328j are all LOW. Power switch transistor M1 turns ON, and power switch transistors M2a-M2d, M3a-M3f, and M4a-M4j are all OFF. As a result, REn signal input buffer circuit 302 is coupled to negative supply VSS and is active, and first repeater circuits 304a-304d, second repeater circuits 306a-306f and data output buffer circuits 308a-308j are all disconnected from negative supply VSS and are inactive. Although REn signal input buffer circuit 302 is active and the input to REn signal input buffer circuit 302 is LOW, the output of REn signal input buffer circuit 302 does not immediately switch from HIGH to LOW.

FIG. 4C illustrates read enable circuit 300a in a second active state, referred to herein as "active state 1." In particular, CEn is LOW, CEi is HIGH, REn is HIGH, the output of control circuit 320 at node N1 is LOW, the output of REn signal input buffer circuit 302 at node N2 is LOW, the outputs of each of first repeater circuits 304a-304d at nodes N4a-N4d, respectively, are all HIGH, the outputs of each of second repeater circuits 306a-306f at nodes N6a-N6f, respectively are all HIGH, and the outputs CLKa-CLKj of data output buffer circuits 308a-308j at nodes N8a-N8j, respectively, are all HIGH.

The output of first switch control circuit 322 and the outputs of second switch control circuits 324a-324d are all HIGH, and the outputs of third switch control circuits 326a-326f, and fourth switch control circuits 328a-328j are all LOW. Power switch transistor M1 is ON, power switch transistors M2a-M2d each turn ON, and power switch transistors M2a-M2d, M3a-M3f, and M4a-M4j are all OFF. As a result, REn signal input buffer circuit 302 and first repeater circuits 304a-304d are each coupled to negative supply VSS and are active, and second repeater circuits 306a-306f and data output buffer circuits 308a-308j are all disconnected from negative supply VSS and are inactive.

Although first repeater circuits 304a-304d are all active and the inputs to first repeater circuits 304a-304d are all LOW, the outputs of first repeater circuits 304a-304d do not immediately switch from HIGH to LOW.

FIG. 4D illustrates read enable circuit 300a in a third active state, referred to herein as "active state 2." In particular, CEn is LOW, CEi is HIGH, REn is HIGH, the output of control circuit 320 at node N1 is LOW, the output of REn signal input buffer circuit 302 at node N2 is LOW, the outputs of each of first repeater circuits 304a-304d at nodes N4a-N4d, respectively, are all LOW, the outputs of each of second repeater circuits 306a-306f at nodes N6a-N6f, respectively are all HIGH, and the outputs CLKa-CLKj of data output buffer circuits 308a-308j at nodes N8a-N8j, respectively, are all HIGH.

The output of first switch control circuit 322, the outputs of second switch control circuits 324a-324d, and the outputs of third switch control circuits 326a-326f are all HIGH, and the outputs of fourth switch control circuits 328a-328j are all LOW. Power switch transistor M1 and power switch transistors M2a-M2d are all ON, power switch transistors M3a-M3f each turn ON, and power switch transistors M4a-M4j are all OFF. As a result, REn signal input buffer circuit 302, first repeater circuits 304a-304d and second repeater circuits 306a-306f are each coupled to negative supply VSS and are active, and data output buffer circuits 308a-308j are all disconnected from negative supply VSS and are inactive. Although second repeater circuits 306a-306f are all active and the inputs to second repeater circuits 306a-306f are all LOW, the outputs of second repeater circuits 306a-306f do not immediately switch from HIGH to LOW.

FIG. 4E illustrates read enable circuit 300a in a fourth active state, referred to herein as "active state 3." In particular, CEn is LOW, CEi is HIGH, REn is HIGH, the output of control circuit 320 at node N1 is LOW, the output of REn signal input buffer circuit 302 at node N2 is LOW, the outputs of each of first repeater circuits 304a-304d at nodes N4a-N4d, respectively, are all LOW, the outputs of each of second repeater circuits 306a-306f at nodes N6a-N6f, respectively are all LOW, and the outputs CLKa-CLKj of data output buffer circuits 308a-308j at nodes N8a-N8j, respectively, are all HIGH.

The output of first switch control circuit 322, the outputs of second switch control circuits 324a-324d, the outputs of third switch control circuits 326a-326f, and the outputs of fourth switch control circuits 328a-328j are all HIGH. Power switch transistor M1, M2a-M2d, and M3a-M3f are all ON, and power switch transistors M4a-M4j each turn ON. As a result, REn signal input buffer circuit 302, first repeater circuits 304a-304d, second repeater circuits 306a-306f, and data output buffer circuits 308a-308j are each coupled to negative supply VSS and are active. Although data output buffer circuits 308a-308j are all active and the inputs to data output buffer circuits 308a-308j are all LOW, the outputs of data output buffer circuits 308a-308j do not immediately switch from HIGH to LOW.

FIG. 4F illustrates read enable circuit 300a in a fifth active state, referred to herein as "active state 4." In particular, CEn is LOW, CEi is HIGH, REn is HIGH, the output of control circuit 320 at node N1 is LOW, the output of REn signal input buffer circuit 302 at node N2 is LOW, the outputs of each of first repeater circuits 304a-304d at nodes N4a-N4d, respectively, are all LOW, the outputs of each of second repeater circuits 306a-306f at nodes N6a-N6f, respectively are all LOW, and the outputs CLKa-CLKj of data output buffer circuits 308a-308j at nodes N8a-N8j, respectively, are all LOW.

The output of first switch control circuit 322, the outputs of second switch control circuits 324a-324d, the outputs of third switch control circuits 326a-326f, and the outputs of fourth switch control circuits 328a-328j are all HIGH. Power switch transistor M1, M2a-M2d, and M3a-M3f, and M4a-M4j are all ON, and REn signal input buffer circuit 302, first repeater circuits 304a-304d, second repeater circuits 306a-306f, and data output buffer circuits 308a-308j are each coupled to negative supply VSS and are active.

Without wanting to be bound by any particular theory, it is believed that the above sequence of five active state stages (active state 0-active state 4) activates each of REn signal input buffer circuit 302, first repeater circuits 304a-304d, second repeater circuits 306a-306f, and data output buffer circuits 308a-308j in read enable circuit 300a in a first predetermined order, and may avoid shoot through currents flowing from one stage to the next subsequent stage.

FIG. 4G illustrates read enable circuit 300a in a sixth active state, referred to herein as "active state 5." In particular, CEn is LOW, CEi is HIGH, REn is LOW, the output of control circuit 320 at node N1 is LOW, the output of REn signal input buffer circuit 302 at node N2 is LOW, the outputs of each of first repeater circuits 304a-304d at nodes N4a-N4d, respectively, are all LOW, the outputs of each of second repeater circuits 306a-306f at nodes N6a-N6f, respectively are all LOW, and the outputs CLKa-CLKj of data output buffer circuits 308a-308j at nodes N8a-N8j, respectively, are all LOW. As will be described below, REn now controls read enable circuit 300a, and the outputs CLKa-CLKj of data output buffer circuits 308a-308j at nodes N8a-N8j follow REn.

FIG. 4H illustrates read enable circuit 300a in a seventh active state, referred to herein as "active state 6." In particular, CEn is LOW, CEi is HIGH, REn is HIGH, the output of control circuit 320 at node N1 is HIGH, the output of REn signal input buffer circuit 302 at node N2 is HIGH, the outputs of each of first repeater circuits 304a-304d at nodes N4a-N4d, respectively, are all HIGH, the outputs of each of second repeater circuits 306a-306f at nodes N6a-N6f, respectively are all HIGH, and the outputs CLKa-CLKj of data output buffer circuits 308a-308j at nodes N8a-N8j, respectively, are all HIGH. Thus as REn toggles LOW and HIGH, the outputs CLKa-CLKj of data output buffer circuits 308a-308j at nodes N8a-N8j follow REn and toggle LOW and HIGH. Indeed, FIG. 4I illustrates read enable circuit 300a in the seventh active state, in which REn is LOW, and the outputs CLKa-CLKj of data output buffer circuits 308a-308j at nodes N8a-N8j follow REn and are LOW.

FIG. 4J illustrates read enable circuit 300a in a second standby state, referred to herein as "standby state 1." In particular, CEn is HIGH, CEi is LOW, REn is LOW, the output of control circuit 320 at node N1 is HIGH, the output of REn signal input buffer circuit 302 at node N2 is LOW, the outputs of each of first repeater circuits 304a-304d at nodes N4a-N4d, respectively, are all LOW, the outputs of each of second repeater circuits 306a-306f at nodes N6a-N6f, respectively are all LOW, and the outputs CLKa-CLKj of data output buffer circuits 308a-308j at nodes N8a-N8j, respectively, are all LOW.

In addition, the outputs of first switch control circuit 322, second switch control circuits 324a-324d, third switch control circuits 326a-326f, fourth switch control circuits 328a-328j are all HIGH, and power switch transistors M1, M2a-M2d, M3a-M3f, and M4a-M4j are all ON. As a result, REn signal input buffer circuit 302, first repeater circuits 304a-304d, second repeater circuits 306a-306f and data output buffer circuits 308a-308j are all connected to negative supply VSS and are all active. Thus, in standby state 1, CEn is HIGH, the high speed circuits (REn signal input buffer circuit 302, first repeater circuits 304a-304d, second repeater circuits 306a-306f and data output buffer circuits 308a-308j) are all active, clock signals CLKa-CLKj are all LOW, and CEn has control of read enable circuit 300a.

FIG. 4K illustrates read enable circuit 300a in a third standby state, referred to herein as "standby state 2." In particular, CEn is HIGH, CEi is LOW, REn is LOW, the output of control circuit 320 at node N1 is HIGH, the output of REn signal input buffer circuit 302 at node N2 is HIGH, the outputs of each of first repeater circuits 304a-304d at nodes N4a-N4d, respectively, are all LOW, the outputs of each of second repeater circuits 306a-306f at nodes N6a-N6f, respectively are all LOW, and the outputs CLKa-CLKj of data output buffer circuits 308a-308j at nodes N8a-N8j, respectively, are all LOW.

In addition, the output of first switch control circuit 322 is LOW, and the outputs of second switch control circuits 324a-324d, third switch control circuits 326a-326f, fourth switch control circuits 328a-328j are all HIGH, power switch transistor M1 is OFF, and power switch transistors M2a-M2d, M3a-M3f, and M4a-M4j are all ON. As a result, REn signal input buffer circuit 302 is disconnected from negative supply VSS and is inactive, and first repeater circuits 304a-304d, second repeater circuits 306a-306f and data output buffer circuits 308a-308j are all connected to negative supply VSS and are all active.

FIG. 4L illustrates read enable circuit 300a in a fourth standby state, referred to herein as "standby state 3." In particular, CEn is HIGH, CEi is LOW, REn is LOW, the output of control circuit 320 at node N1 is HIGH, the output of REn signal input buffer circuit 302 at node N2 is HIGH, the outputs of each of first repeater circuits 304a-304d at nodes N4a-N4d, respectively, are all HIGH, the outputs of each of second repeater circuits 306a-306f at nodes N6a-N6f, respectively are all LOW, and the outputs CLKa-CLKj of data output buffer circuits 308a-308j at nodes N8a-N8j, respectively, are all LOW.

In addition, the outputs of first switch control circuit 322 and second switch control circuits 324a-324d are all LOW, the outputs of third switch control circuits 326a-326f and fourth switch control circuits 328a-328j are all HIGH, power switch transistors M1 and M2a-M2d are all OFF, power switch transistors M3a-M3f, and M4a-M4j are all ON. As a result, REn signal input buffer circuit 302 and first repeater circuits 304a-304d are disconnected from negative supply VSS and are inactive, and second repeater circuits 306a-306f and data output buffer circuits 308a-308j are all connected to negative supply VSS and are all active.

FIG. 4M illustrates read enable circuit 300a in a fifth standby state, referred to herein as "standby state 4." In particular, CEn is HIGH, CEi is LOW, REn is LOW, the output of control circuit 320 at node N1 is HIGH, the output of REn signal input buffer circuit 302 at node N2 is HIGH, the outputs of each of first repeater circuits 304a-304d at nodes N4a-N4d, respectively, are all HIGH, the outputs of each of second repeater circuits 306a-306f at nodes N6a-N6f, respectively are all HIGH, and the outputs CLKa-CLKj of data output buffer circuits 308a-308j at nodes N8a-N8j, respectively, are all LOW.

In addition, the outputs of first switch control circuit 322, second switch control circuits 324a-324d, and third switch control circuits 326a-326f are all LOW, the outputs of fourth switch control circuits 328a-328j are all HIGH, power switch transistors M1, M2a-M2d and M3a-M3f are all OFF, and power switch transistors M4a-M4j are all ON. As a result, REn signal input buffer circuit 302, first repeater circuits 304a-304d, and second repeater circuits 306a-306f are disconnected from negative supply VSS and are inactive, and data output buffer circuits 308a-308j are all connected to negative supply VSS and are all active.

FIG. 4N illustrates read enable circuit 300a in a sixth standby state, referred to herein as "standby state 5." In particular, CEn is HIGH, CEi is LOW, REn is LOW, the output of control circuit 320 at node N1 is HIGH, the output of REn signal input buffer circuit 302 at node N2 is HIGH, the outputs of each of first repeater circuits 304a-304d at nodes N4a-N4d, respectively, are all HIGH, the outputs of each of second repeater circuits 306a-306f at nodes N6a-N6f, respectively are all HIGH, and the outputs CLKa-CLKj of data output buffer circuits 308a-308j at nodes N8a-N8j, respectively, are all HIGH.

In addition, the outputs of first switch control circuit 322, second switch control circuits 324a-324d, third switch control circuits 326a-326f, and fourth switch control circuits 328a-328j are all LOW, power switch transistors M1, M2a-M2d and M3a-M3f, and M4a-M4j are all OFF. As a result, REn signal input buffer circuit 302, first repeater circuits 304a-304d, second repeater circuits 306a-306f, and data output buffer circuits 308a-308j are disconnected from negative supply VSS and are inactive.

FIG. 4O illustrates read enable circuit 300a in a seventh standby state, referred to herein as "standby state 6." In particular, CEn is HIGH, CEi is LOW, REn is HIGH, the output of control circuit 320 at node N1 is HIGH, the output of REn signal input buffer circuit 302 at node N2 is HIGH, the outputs of each of first repeater circuits 304a-304d at nodes N4a-N4d, respectively, are all HIGH, the outputs of each of second repeater circuits 306a-306f at nodes N6a-N6f, respectively are all HIGH, and the outputs CLKa-CLKj of data output buffer circuits 308a-308j at nodes N8a-N8j, respectively, are all HIGH.

In addition, the outputs of first switch control circuit 322, second switch control circuits 324a-324d, third switch control circuits 326a-326f, and fourth switch control circuits 328a-328j are all LOW, power switch transistors M1, M2a-M2d and M3a-M3f, and M4a-M4j are all OFF. As a result, REn signal input buffer circuit 302, first repeater circuits 304a-304d, second repeater circuits 306a-306f, and data output buffer circuits 308a-308j are disconnected from negative supply VSS and are inactive.

Without wanting to be bound by any particular theory, it is believed that the above sequence of six standby state stages (standby state 1-active state 6) inactivates each of REn signal input buffer circuit 302, first repeater circuits 304a-304d, second repeater circuits 306a-306f, and data output buffer circuits 308a-308j in read enable circuit 300a in a second predetermined order, and may avoid shoot through currents flowing from one stage to the next subsequent stage.

Figure 5A:
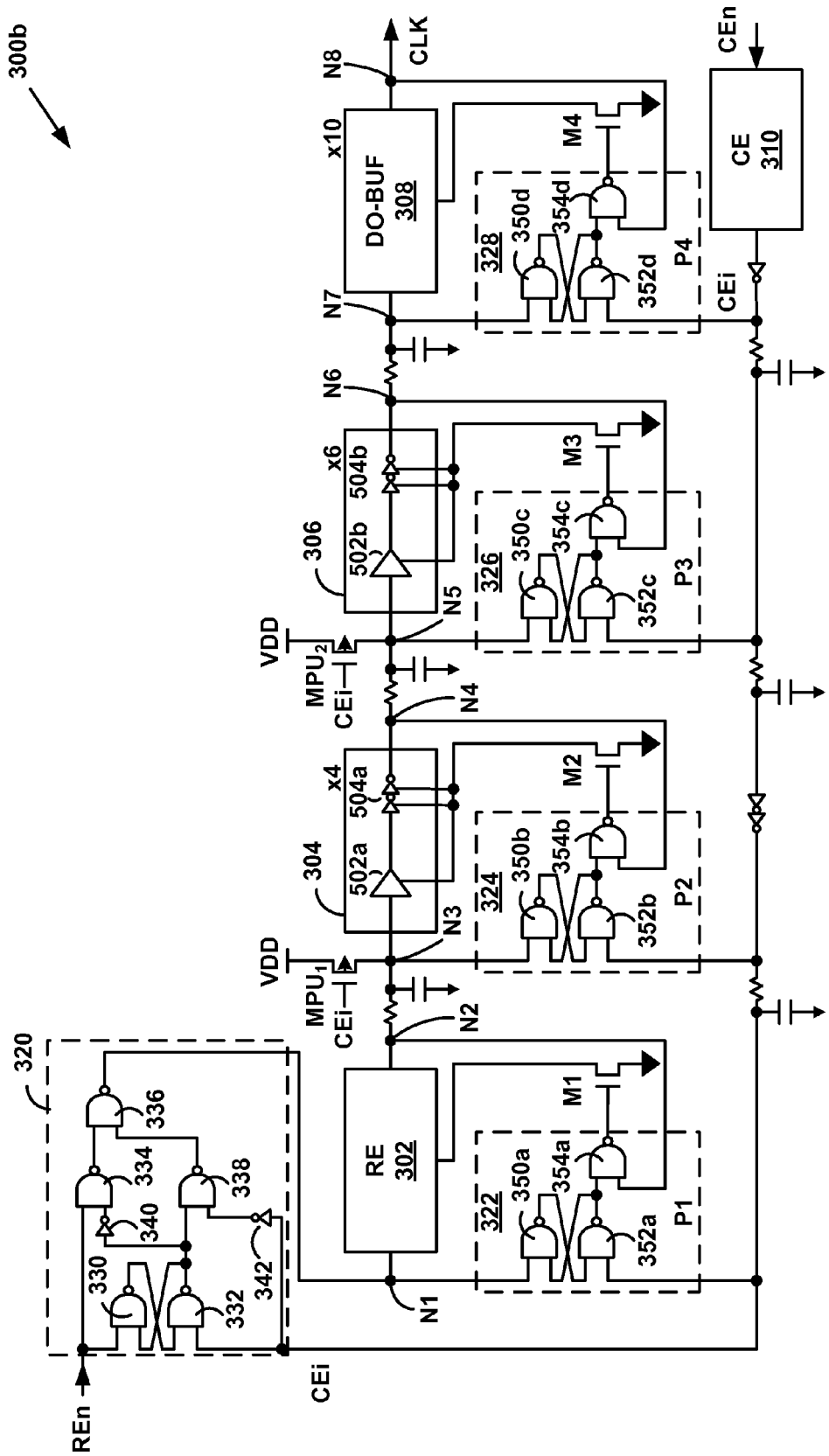
FIG. 5A is a diagram of another I/O interface circuit of this technology.

FIG. 5A is a diagram illustrating an embodiment of another read enable circuit 300b. Read enable circuit 300b receives REn and CEn signals and provides clock signals CLK that provide data output timing to data output buffers (e.g., DQ0, DQ1, . . . , DQ7, DQS and BDQS, not shown). Read enable circuit 300b is similar to read enable circuit 300a of FIG. 3A, but also includes first pull-up transistor $MPU_1$ coupled between the positive supply terminal and node N3, and second pull-up transistor $MPU_2$ coupled between the positive supply terminal and node N5. Each of first pull-up transistor $MPU_1$ and second pull-up transistor $MPU_2$ have gate terminals coupled to CEi. In standby mode (CEn=HIGH and CEi=LOW), first pull-up transistor $MPU_1$ turns ON, pulling nodes N2 and N3 HIGH, and second pull-up transistor MPU$_2$ turns ON, pulling nodes N4 and N5 HIGH. Thus, first pull-up transistor MPU$_1$ and second pull-up transistor MPU$_2$ may be used to ensure that nodes N2, N3, N4 and N5 are in a known HIGH state in standby mode.

FIG. 5A also illustrates example circuit elements of first repeater circuits 304a-304d and second repeater circuits 306a-306f. In an embodiment, each of first repeater circuits 304a-304d includes a duty cycle corrector circuit 502a and a buffer circuit 504a, and each of second repeater circuits 306a-306f includes a duty cycle corrector circuit 502b and a buffer circuit 504b.

Figure 5B:
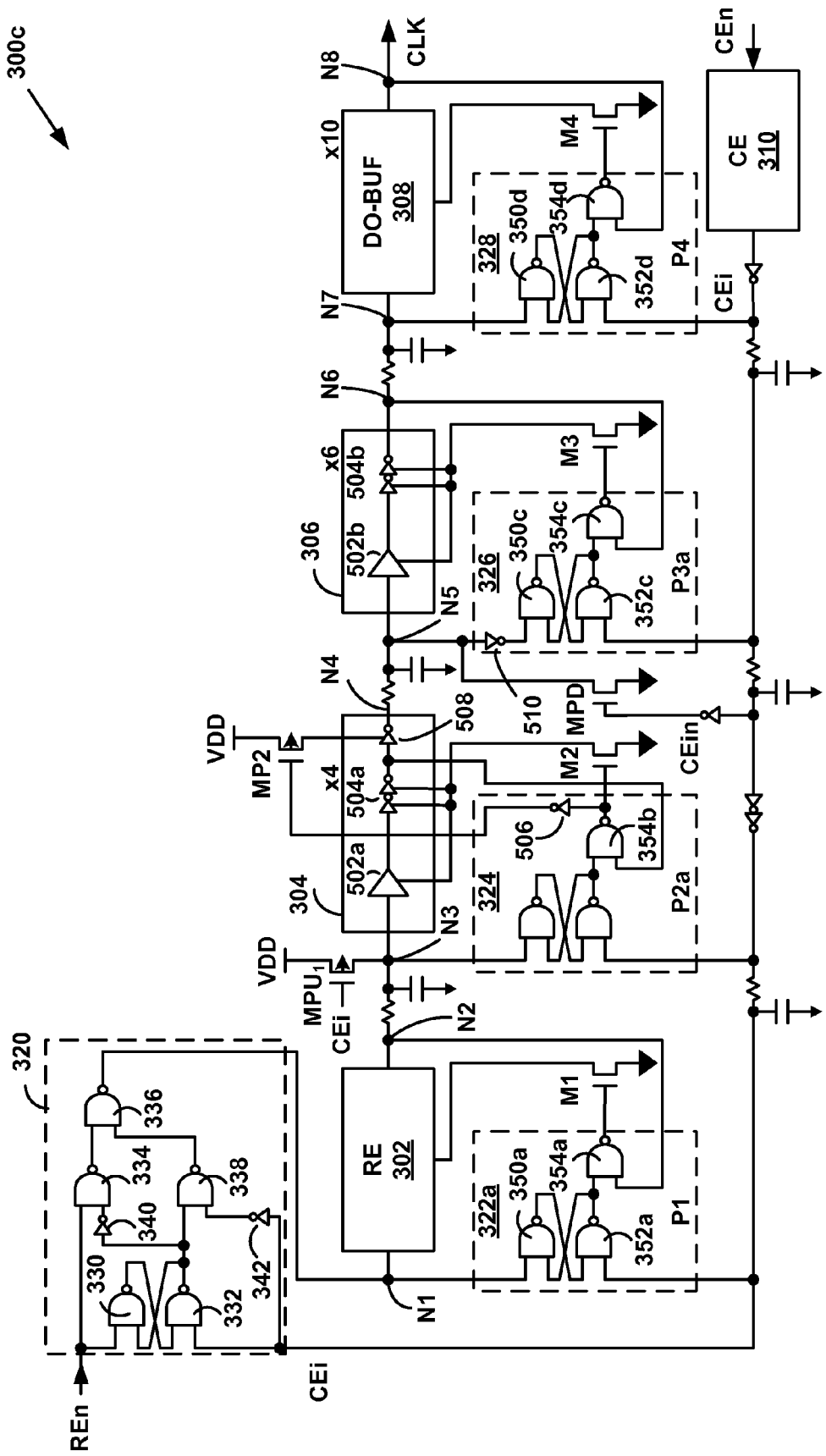
FIG. 5B is a diagram of yet another I/O interface circuit of this technology.

FIG. 5B is a diagram illustrating an embodiment of another read enable circuit 300c. Read enable circuit 300c receives REn and CEn signals and provides clock signals CLK that provide data output timing to data output buffers (e.g., DQ0, DQ1, . . . , DQ7, DQS and BDQS, not shown). Read enable circuit 300c is similar to read enable circuit 300b of FIG. 5A, but also includes p-channel power switch transistors MP2a-MP2d that are used to connect and disconnect first repeater circuits 304a-304d, respectively, from the positive supply terminal at substantially the same time that n-channel power switch transistors M2a-M2d disconnect first repeater circuits 304a-304d, respectively, from the negative supply terminal. To generate control signals for p-channel power switch transistors MP2a-MP2d, each of second switch control circuits 324a-324d includes an inverter 506 coupled to the output terminal of NAND gate 354b.

In addition, FIG. 5B also illustrates example circuit elements of first repeater circuits 304a-304d, each of which includes duty cycle corrector circuit 502a and buffer circuit 504a coupled to n-channel power switch transistors M2a-M2d, and an inverter circuit 508 coupled to p-channel power switch transistors MP2a-MP2d. Because of the phase difference between first repeater circuits 304a-304d and second repeater circuits 306a-306f, each of third switch control circuits 326a-326f includes and inverter circuit 510 coupled between nodes N5 and the first input terminal of NAND gate 350c. In addition, an n-channel pull-down transistor MPD is coupled between nodes N5 and the negative supply terminal, and has a gate terminal coupled to CEin (the inverse of signal CEi). Thus, in standby mode, CEn=HIGH, and nodes N5 are pulled down LOW.

Figure 6:
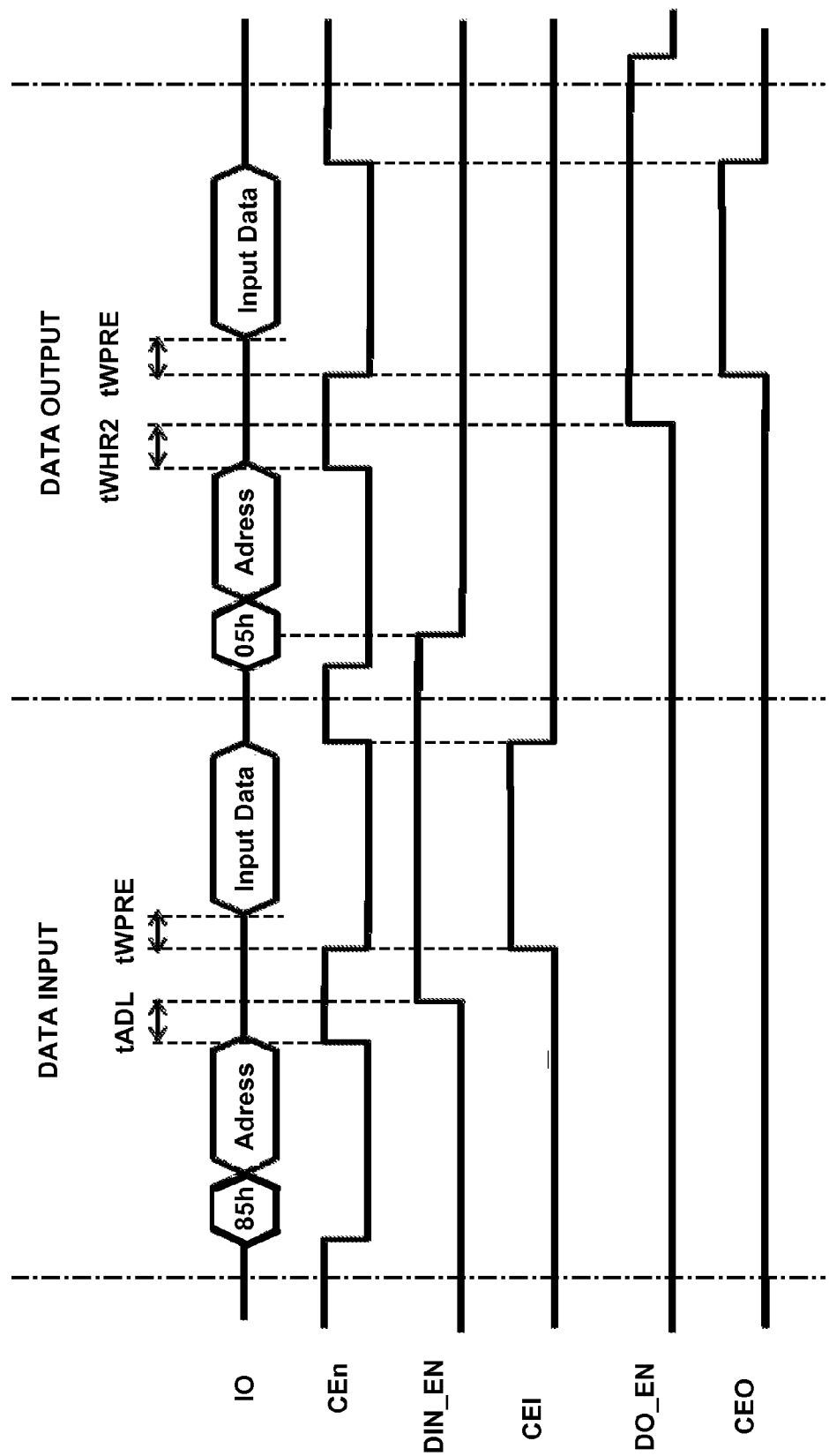
FIG. 6 is a diagram of an alternative timing system that may be used with the circuits of FIGS. 3A-3B, 4A-4O and 5A-5B.

FIG. 6 is a diagram of an alternative timing system that may be used with the circuits of FIGS. 3A-3B, 4A-4O and 5A-5B. In particular, in a data output embodiment, external CEn signal can be replaced by a signal CEO, and in a data input embodiment, external CEn signal can be replaced by a signal CEI:

$$CEO = \overline{CEn} \times DO\_EN$$

$$CEI = \overline{CEn} \times DI\_EN$$

where DO_EN and DI_EN are data output enable and data input enable signals, respectively.

FIG. 6 illustrates how signals CEO and CEI are activated. In the data input mode:
1) The control logic accepts data input command 85h. After tADL, it activates signal DIN_EN.
2) When serial data input starts, CEn goes LOW. By the falling edge of CEn, CEI activates. During tWPRE, all power switch transistors M1, M2, M3 and M4 are activated.
3) After data input is over, CEn goes HIGH. By the rising edge of CEn, CEI is disabled.

In the data output mode,
1) The control logic accepts data output command 05h. After tWHR2, it activates signal DO_EN.
2) When serial data output starts, CEn goes LOW. By the falling edge of CEn, CEO activates. During tRPRE, all power switch transistors M1, M2, M3 and M4 are activated.
3) After data output is over, CEn goes HIGH. By the rising edge of CEn, CEO is disabled.
4) CEO is active only during serial Dout. Similar circuit is prepared for Din and activated separately from Dout.

Without wanting to be bound by any particular theory, it is believed that the peak/average current increase is spread between Dout and Din, and so is minimized.

Figure 7:
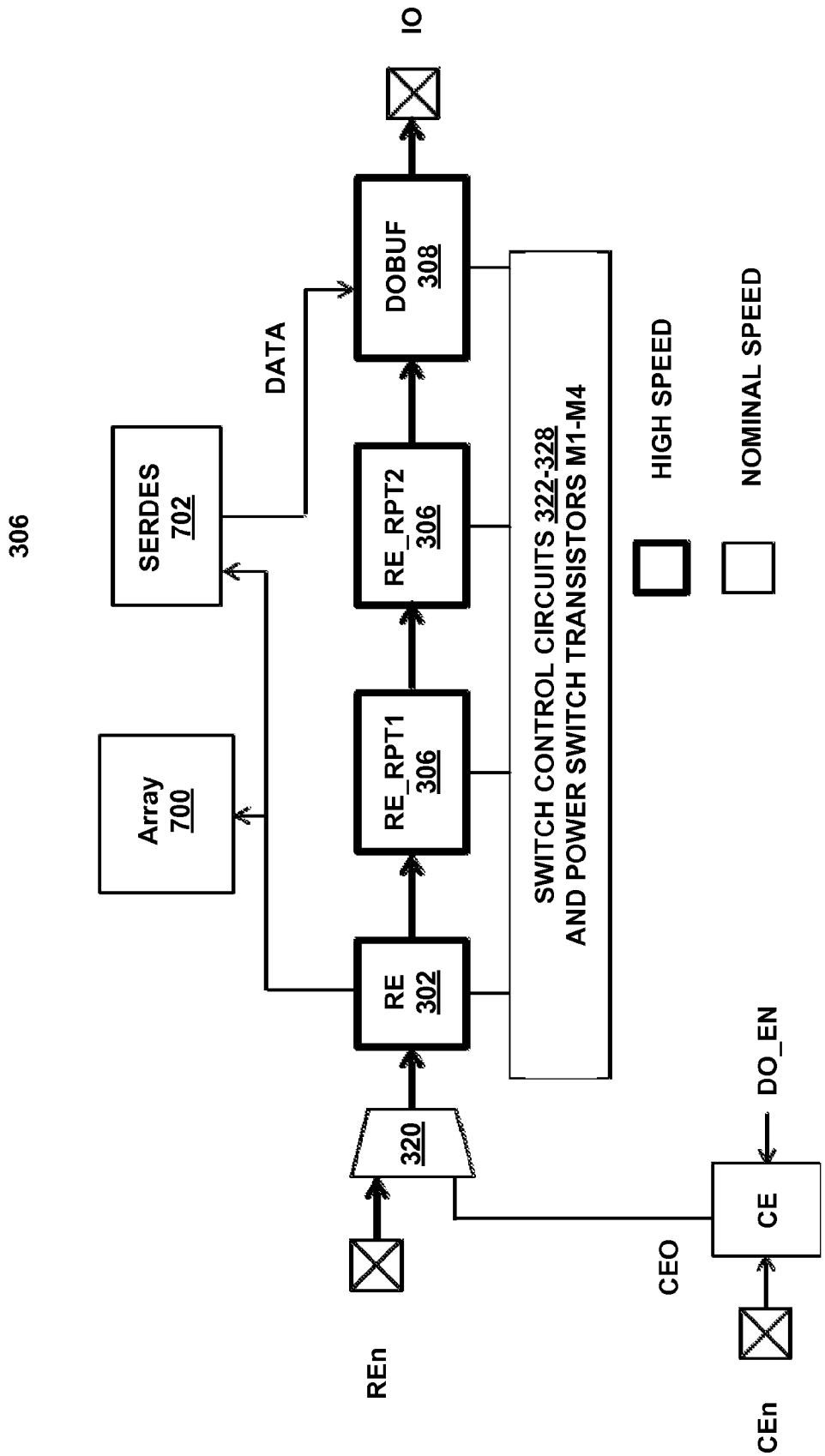
FIG. 7 is a block diagram of a data output circuit embodiment of this technology.

FIG. 7 is a block diagram of a data output (Dout) circuit embodiment of this technology. Array 700 is a direct peripheral circuit of a memory array, such as memory array 110 of FIG. 1. SERDES circuit block 702 serializes data from array 700 for DOBUF, and de-serializes data from chip exterior for Array 700. Signal CEO turns ON power switch transistors M1, M2, M3 and M4. Signal DO_EN is activated when the operation is data output mode by control logic. CEO is activated when DO_EN is HIGH and CEn is LOW.

In an embodiment, to reduce peak/average current increase, power switch transistors M1, M2, M3 and M4 are inserted only in high speed path where high-Ion/Ioff transistors are used. In an embodiment, to increase timing margin between CEO start to REn signal input start, the connection direction of CEO signal is the same as critical signal flow from REn to IO.

In an embodiment, delay is intentionally added to CEO signal using resistors and capacitors (not shown in FIG. 7). Power switch transistors M1, M2, M3 and M4 turn ON one by one to control/minimize peak current increase.

In an embodiment, CEO signal is active only during serial Dout. Similar circuit is prepared for data input (Din) and activated separately from Dout to spread (and therefore minimize) peak/average current increase between Dout and Din.

Figure 8:
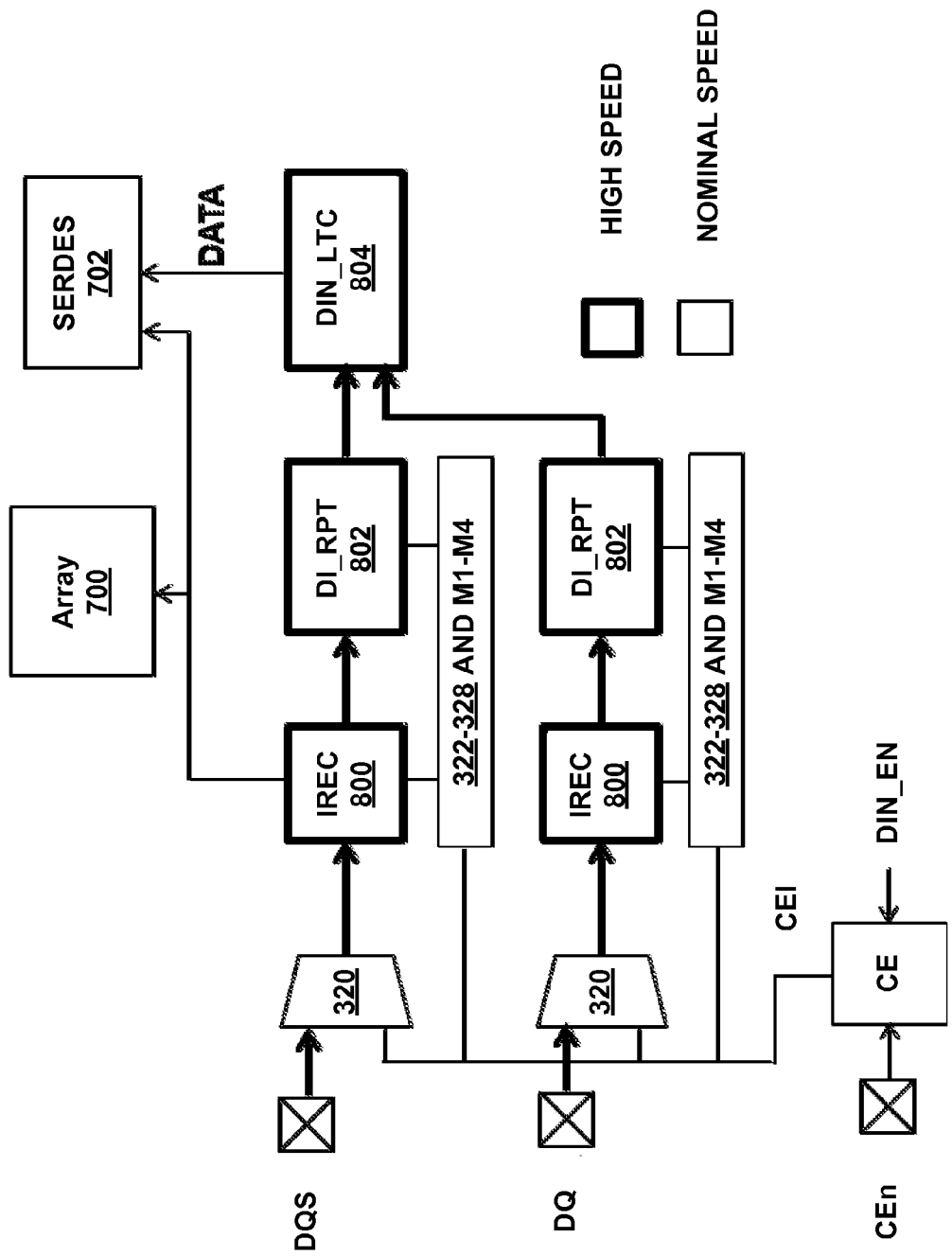
FIG. 8 is a block diagram of a data input circuit embodiment of this technology.

FIG. 8 is a block diagram of a data input circuit embodiment of this technology. IREC 800, DI_RPT 802 and DIN_LTC 804 are data input receiver, data input repeater and data input latch, respectively. Data input signal CEI turns ON power switch transistors M1, M2, M3 and M4. Signal DIN_EN is activated when the operation is data input mode by control logic. CEI is activated when DIN_EN is HIGH and CEn is LOW.

Figure 9:
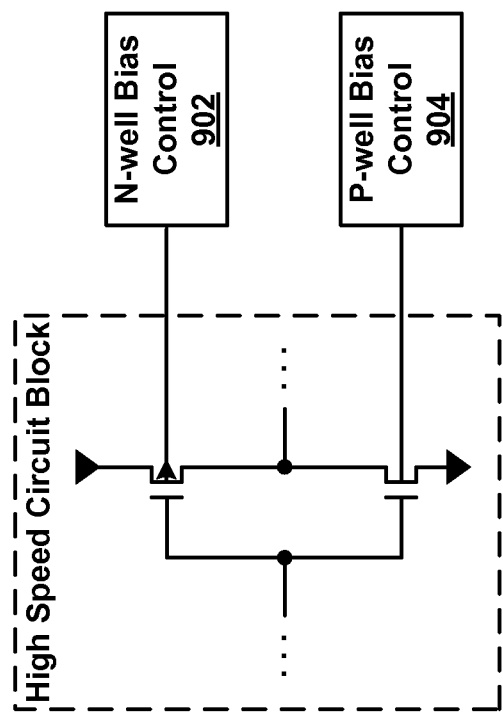
FIG. 9 is diagram of an alternative embodiment of this technology.

FIG. 9 is diagram of an alternative embodiment of this technology. In particular, instead of using power switch transistors to activate and inactivate high speed circuit blocks, N-well bias control circuit 902 and P-well bias control circuit 904 are used to control voltage levels of N-wells and P-wells of the transistors in the high speed circuit blocks. For example, in stand-by mode, the N-well bias control circuit 902 increases N-well voltage and P-well bias control circuit 904 lowers the P-well voltage to reduce Ioff through the p-channel transistors and n-channel transistors, respectively, of the high speed circuit block. In active mode, N-well bias control circuit 902 decreases the N-well voltage level and P-well bias control circuit 904 increases the P-well voltage to increase Ion through p-channel transistors and re-channel transistors, respectively, of the high speed circuit blocks.

Accordingly, it can be seen that in one embodiment, an input/output interface circuit is provided for a memory device. The input/output interface circuit receives a first control signal and a second control signal, and provides an output clock signal. The input/output interface circuit includes a plurality of circuit blocks coupled in series, the a plurality of circuit blocks including an input terminal coupled to the first control signal and the second control signal, and an output terminal providing the output clock signal, a plurality of power switch transistors, each power switch transistor including a control terminal and coupled between a corresponding one of the circuit blocks and a power supply terminal, and a plurality of switch control circuits, each switch control circuit coupled to the control terminal of a corresponding one of the power switch transistors. The switch control circuits are configured to activate the circuit blocks in a first predetermined order and deactivate the circuit blocks in a second predetermined order.

In another embodiment, a method of providing an input/output interface clock signal for a memory device is provided. The method includes receiving a first control signal and a second control signal, providing a plurality of circuit blocks comprising an input terminal and an output terminal providing the clock signal, coupling the first control signal and the second control signal to the input terminal of the plurality of circuit blocks, providing a plurality of power switch transistors, each power switch transistor comprising a control terminal and coupled between a corresponding one of the circuit blocks and a power supply terminal, providing a plurality of switch control circuits, each switch control circuit coupled to the control terminal of a corresponding one of the power switch transistors, and using the switch control circuits to activate the circuit blocks in a first predetermined order and deactivate the circuit blocks in a second predetermined order.

In another embodiment, an input/output interface circuit for a memory device is provided. The input/output interface circuit receives a first control signal and a second control signal, and provides an output clock signal. The input/output interface circuit includes a control circuit, a plurality of circuit blocks, a plurality of switch control circuits, and a plurality of power switch transistors. The control circuit includes a first control circuit input terminal coupled to the first control signal, a second control circuit input terminal coupled to the second control signal, and a control circuit output terminal. The plurality of circuit blocks each include a first circuit block input terminal, a second circuit block input terminal, and a circuit block output terminal, the circuit blocks coupled in series, the first circuit block input terminal of one of the circuit blocks coupled to the control circuit output terminal, and the circuit block output terminal of one of circuit blocks providing the output clock signal. The plurality of switch control circuits each include a first switch control input terminal coupled to the first circuit block input terminal of a corresponding one of the circuit blocks, a second switch control input terminal coupled to the second control signal, a third switch control input terminal coupled to the circuit block output terminal of the corresponding one of the circuit blocks, and a switch control output terminal. The plurality of power switch transistors each includes a first transistor terminal coupled to a corresponding one of the second circuit block input terminals, a second transistor terminal coupled to a corresponding one of the switch control output terminals, and a third transistor terminal coupled to a power supply terminal. The control circuit and the switch control circuits are configured to activate the circuit blocks in a first predetermined order and deactivate the circuit blocks in a second predetermined order.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

The invention claimed is:

1. An input/output interface circuit comprising:
a plurality of circuit blocks coupled in series, the plurality of circuit blocks comprising an input terminal coupled to a first control signal and a second control signal;
a plurality of power switch transistors each comprising a control terminal and coupled between a corresponding one of the circuit blocks and a power supply terminal; and
a plurality of switch control circuits each coupled to the second control signal and the control terminal of a corresponding one of the power switch transistors, wherein the switch control circuits are configured to activate the circuit blocks in a first predetermined order and deactivate the circuit blocks in a second predetermined order,
wherein:
the plurality of power switch transistors each comprise a first transistor type; and
the circuit blocks comprise transistors that comprise a second transistor type that comprises a lower input capacitance and higher output current than the first transistor type.

2. The input/output interface circuit of claim 1, wherein the switch control circuits comprise transistors that comprise the first transistor type.

3. The input/output interface circuit of claim 1, wherein the circuit blocks comprise transistors that comprise a second transistor type that comprises a shorter gate length and/or lower threshold voltages than the first transistor type.

4. The input/output interface circuit of claim 3, wherein the switch control circuits comprise transistors that comprise the first transistor type.

5. The input/output interface circuit of claim 1, wherein the circuit blocks comprise any of a read enable negative signal input buffer circuit, a first repeater circuit, a second repeater circuit and a data output buffer circuit.

6. The input/output interface circuit of claim 1, further comprising a control circuit that receives the first control signal at a first control circuit input terminal, the second control signal at a second control circuit input terminal, and provides a control output signal at a control circuit output terminal, wherein the control circuit output terminal is coupled to the input terminal of the plurality of circuit blocks.

7. The input/output interface circuit of claim 6, wherein the control circuit and the switch control circuits are configured to inactivate the circuit blocks when the second control signal has a first predetermined value, and activate the circuit blocks when the second control signal has a second predetermined value.

8. The input/output interface circuit of claim 1, wherein:
the plurality of circuit blocks comprise a first circuit block, a second circuit block, and a third circuit block, the second circuit block having an input terminal coupled to an output terminal of the first circuit block, and an output terminal coupled to an input terminal of the third circuit block; and
wherein the switch control circuits are configured to activate the first circuit block before activating the second circuit block, and activate the second circuit block before activating the third circuit block.

9. The input/output interface circuit of claim 1, wherein:
the plurality of circuit blocks comprises a first circuit block, a second circuit block, and a third circuit block; and
wherein the switch control circuits are configured to deactivate the first circuit block before deactivating the second circuit block, and deactivate the second circuit block before deactivating the third circuit block.

10. A method comprising:
coupling a plurality of circuit blocks in series;
coupling a first control signal and a second control signal to an input terminal of the plurality of circuit blocks;
coupling a control terminal of each of a plurality of power switch transistors between a corresponding one of the circuit blocks and a power supply terminal;
coupling each of a plurality of switch control circuits to the second control signal and a control terminal a corresponding one of the power switch transistors; and
responsive to the first control signal and the second control signal, causing the switch control circuits to activate the circuit blocks in a first predetermined order and deactivate the circuit blocks in a second predetermined order,
wherein:
the plurality of power switch transistors each comprise a first transistor type; and
the circuit blocks comprise transistors that comprise a second transistor type that comprises a shorter gate length and/or lower threshold voltages than the first transistor type.

11. The method of claim 10, wherein
the circuit blocks comprise transistors that comprise a second transistor type that comprises a lower input capacitance and higher output current than the first transistor type.

12. The method of claim 11, wherein the switch control circuits comprise transistors that comprise the first transistor type.

13. The method of claim 10, wherein the switch control circuits comprise transistors that comprise the first transistor type.

14. The method of claim 10, wherein the circuit blocks comprise any of a read enable negative signal input buffer circuit, a first repeater circuit, a second repeater circuit and a data output buffer circuit.

15. The method of claim 10, further comprising:
providing a control circuit that comprises a first control circuit input terminal, a second control circuit input terminal, and a control circuit output terminal that provides a control output signal;
coupling the first control signal to the first control circuit input terminal;
coupling the second control signal to the second control circuit input terminal; and coupling the control circuit output terminal to the input terminal of the plurality of circuit blocks.

16. The method of claim 15, further comprising configuring the control circuit and the switch control circuits to inactivate the circuit blocks when the second control signal has a first predetermined value, and to activate the circuit blocks when the second control signal has a second predetermined value.

17. The method of claim 10, wherein:
the plurality of circuit blocks comprise a first circuit block, a second circuit block, and a third circuit block; and
the method further comprises responsive to the first control signal and the second control signal, causing the switch control circuits to activate the first circuit block before activating the second circuit block, and activate the second circuit block before activating the third circuit block.

18. The method of claim 10, wherein:
the plurality of circuit blocks comprise a first circuit block, a second circuit block, and a third circuit block; and
the method further comprises responsive to the first control signal and the second control signal, causing the switch control circuits to deactivate the first circuit block before deactivating the second circuit block, and deactivate the second circuit block before deactivating the third circuit block.

19. An input/output interface circuit comprising:
a plurality of series-coupled circuit blocks comprising a first circuit block, a second circuit block, a third circuit block and a fourth circuit block, the first circuit block comprising an input terminal coupled to a first control signal and a second control signal;
a plurality of power switch transistors each comprising a control terminal and coupled between a corresponding one of the circuit blocks and a power supply terminal; and
a plurality of switch control circuits coupled to the second control signal and the control terminal of a corresponding one of the power switch transistors, wherein the plurality of switch control circuits are configured to:
activate the first circuit block before activating the second circuit block, activate the second circuit block before activating the third circuit block, and activate the third circuit block before activating the fourth circuit block; and
deactivate the first circuit block before deactivating the second circuit block, deactivate the second circuit block before deactivating the third circuit block, and deactivate the third circuit block before deactivating the fourth circuit block,
wherein:
the plurality of power switch transistors each comprise a first transistor type; and
the circuit blocks comprise transistors that comprise a second transistor type that comprises a lower input capacitance and higher output current than the first transistor type.

20. The input/output interface circuit of claim 19, wherein the switch control circuits comprise transistors that comprise the first transistor type.

21. The input/output interface circuit of claim 19, wherein the circuit blocks comprise transistors that comprise a second transistor type that comprises a shorter gate length and/or lower threshold voltages than the first transistor type.

22. The input/output interface circuit of claim 21, wherein the switch control circuits comprise transistors that comprise the first transistor type.

23. The input/output interface circuit of claim 19, wherein the circuit blocks comprise any of a read enable negative signal input buffer circuit, a first repeater circuit, a second repeater circuit and a data output buffer circuit.

24. The input/output interface circuit of claim 19, wherein the switch control circuits are configured to inactivate the plurality of series-coupled circuit blocks when the second control signal has a first predetermined value, and to activate the plurality of series-coupled circuit blocks when the second control signal has a second predetermined value.

25. The input/output interface circuit of claim 19, wherein the first control signal comprises a read enable negative control signal and the second control signal comprises a chip enable control signal.

* * * * *